(12) United States Patent
Shioga et al.

(10) Patent No.: US 7,863,524 B2
(45) Date of Patent: Jan. 4, 2011

(54) INTERPOSER AND METHOD FOR MANUFACTURING THE SAME

(75) Inventors: Takeshi Shioga, Kawasaki (JP);
Kazuaki Kurihara, Kawasaki (JP);
Kanae Nakagawa, Kawasaki (JP); Taiji Sakai, Kawasaki (JP); Masataka Mizukoshi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 260 days.

(21) Appl. No.: 11/902,251

(22) Filed: Sep. 20, 2007

(65) Prior Publication Data

US 2008/0073110 A1    Mar. 27, 2008

(30) Foreign Application Priority Data

Sep. 26, 2006   (JP)   ............... 2006-260548

(51) Int. Cl.
*H05K 1/16* (2006.01)
(52) U.S. Cl. ....................... 174/260; 174/262
(58) Field of Classification Search ............ 174/260, 174/261, 262
See application file for complete search history.

(56) References Cited

U.S. PATENT DOCUMENTS

| | | | |
|---|---|---|---|
| 4,667,214 A * | 5/1987 | Sekimura et al. ............. 257/53 |
| 5,177,670 A | 1/1993 | Shinohara et al. | |
| 5,455,064 A | 10/1995 | Chou et al. | |
| 6,515,324 B2 | 2/2003 | Shibuya et al. | |
| 6,573,584 B1 * | 6/2003 | Nagakari et al. ............. 257/528 |
| 7,215,531 B2 * | 5/2007 | Naito et al. ............. 361/306.1 |
| 7,336,501 B2 * | 2/2008 | Tanaka et al. ............. 361/766 |
| 2004/0184219 A1 | 9/2004 | Otsuka et al. | |
| 2006/0038288 A1 | 2/2006 | Yoshioka et al. | |
| 2007/0004100 A1 * | 1/2007 | Maekawa et al. ........... 438/149 |

FOREIGN PATENT DOCUMENTS

| JP | 4-211191 | 8/1992 |
|---|---|---|
| JP | 7-176453 | 7/1995 |
| JP | 2001-35990 | 2/2001 |
| JP | 2001-68583 | 3/2001 |
| JP | 2002-83892 | 3/2002 |
| JP | 2004-304159 | 10/2004 |
| JP | 2006-60119 | 3/2006 |

OTHER PUBLICATIONS

K. Matsumaru, et al.; "Transmission characteristics of the Silicon Through-hole Interconnections and the Glass Through-hole Interconnections;" *The 15th Microelectronics Symposium (MES2005)*; Oct. 2005; pp. 193-196 (2 Sheets.)/Yes-Abstract.

* cited by examiner

*Primary Examiner*—Ishwarbhai B Patel
(74) *Attorney, Agent, or Firm*—Fujitsu Patent Center

(57) ABSTRACT

The interposer includes a glass substrate 46 with first through-electrodes 47 buried in; a plurality of resin layers 68, 20, 32 supported by the glass substrate; thin film capacitors 18a, 18b buried between a first resin layer 68 of the plural resin layers and a second resin layer 20 of the plural resin layers and including the first capacitor electrodes 12a, 12b, the second capacitor electrodes 16 opposed to the first capacitor electrodes 12a, 12b, and a dielectric thin film 14 of a relative dielectric constant of 200 or above formed between the first capacitor electrode 12a, 12b and the second capacitor electrode 16, and the second through-electrodes 77a, 77b penetrating the plural resin layers 68, 20, 32, electrically connected to the first through-electrode 47 and electrically connected to the first capacitor electrode 12a, 12b or the second capacitor electrode 16.

12 Claims, 28 Drawing Sheets

INTERPOSER AND METHOD FOR MANUFACTURING THE SAME

CROSS-REFERENCE TO RELATED APPLICATION

This application is based upon and claims priority of Japanese Patent Application No. 2006-260548, filed on Sep. 26, 2006, the contents being incorporated herein by reference.

BACKGROUND OF THE INVENTION

The present invention relates to an interposer and a method for manufacturing an interposer, more specifically an interposer including a dielectric thin film of very high dielectric constant, and a method for manufacturing the interposer.

Recently, the digital LSIs (Large Scale Integrated circuits), etc., typically microprocessors have the operation speed increased and the electric power consumption lowered.

In order to operate the LSI in the high-frequency range of the GHz band and at low voltage, it is very important to suppress the power source voltage fluctuation due to abrupt fluctuations of the load impedance, etc. of the LSI while removing high-frequency noises of the power source.

Conventionally, the power source voltage has been regulated, and the high-frequency noises have been removed, by mounting decoupling capacitors near the LSI, etc. mounted on a printed circuit board. The decoupling capacitors are formed on a substrate different from the printed circuit board and are suitably mounted on the printed circuit board.

However, in mounting the decoupling capacitors near the LSI mounted on the printed circuit board, the LSI and the decoupling capacitors are electrically connected to each other via the interconnections formed on the printed circuit board, whereby large inductance due to the wiring of the interconnections is present. With the large inductance present between the LSI and the decoupling capacitors, the power source voltage cannot be sufficiently regulated, and the high-frequency noises cannot be sufficiently removed. For the sufficient regulation of the source voltage and the high-frequency noise removal, it is required to decrease the equivalent serial resistance (ESR) and the equivalent serial inductance (ESL).

Here, the technique of disposing interposers with capacitors built in are disposed between the LSI and the printed circuit board is noted (Patent References 1 to 6).

Following references disclose the background art of the present invention.

[Patent Reference 1]
Specification of Japanese Patent Application Unexamined Publication No. Hei 4-211191
[Patent Reference 2]
Specification of Japanese Patent Application Unexamined Publication No. Hei 7-176453
[Patent Reference 3]
Specification of Japanese Patent Application Unexamined Publication No. 2001-68583
[Patent Reference 4]
Specification of Japanese Patent Application Unexamined Publication No. 2001-35990
[Patent Reference 5]
Specification of Japanese Patent Application Unexamined Publication No. 2004-304159
[Patent Reference 6]
Specification of Japanese Patent Application Unexamined Publication No. 2002-83892
[Patent Reference 7]
Specification of Japanese Patent Application Unexamined Publication No. 2006-60119
[Non-Patent Reference 1]
K. Matsumaru et al., "Transmission characteristics of the Silicon Through-hole Interconnections and the Glass Through-hole Interconnections", The 15th Microelectronics Symposium (MES2005), October, 2005, p. 193-196

However, in the technique disclosed in Patent References 1-5, through-holes must be formed in a semiconductor substrate, etc. so as to bury through-electrodes in the semiconductor substrate, etc. It takes long time and high cost to form the through-holes in the semiconductor substrate, etc. Accordingly, it is very difficult to decrease the cost by the technique disclosed in Patent references 1-5.

In the technique disclosed in Patent Reference 6, films are formed on an organic film (resin layer) to form capacitors, which makes it impossible to form the dielectric film of good crystallinity, because when a dielectric film is formed on a resin layer, whose heat resistance is not so high, the process for forming the dielectric film is limited to 400° C. or below. The dielectric film formed on a resin layer generally has a dielectric constant of about 20, and the high dielectric constant is about 50 at highest. Thus, the capacitors of high dielectric constant cannot be realized.

SUMMARY OF THE INVENTION

An object of the present invention is to provide at low cost an interposer including a thin-film capacitor of very large capacitance.

According to one aspect of the present invention, there is provided an interposer including: a glass substrate with a first through-electrode buried in; a plurality of resin layers supported by the glass substrate; a thin film capacitor buried between a first resin layer of said plurality of resin layers and a second resin layer of the plurality of resin layers, the thin film capacitor including a first capacitor electrode, a second capacitor electrode opposed to the first capacitor electrode, and a dielectric thin film of a relative dielectric constant of 200 or above formed between the first capacitor electrode and the second capacitor electrode; and a second through-electrode penetrating the plurality of resin layers, electrically connected to the first through-electrode, and electrically connected to the first capacitor electrode or the second capacitor electrode.

According to another aspect of the present invention, there is provided a method for manufacturing an interposer including the steps of: forming over one primary surface of a semiconductor substrate a thin film capacitor including a first capacitor electrode, a crystalline dielectric thin film formed over the first capacitor electrode and a second capacitor electrode formed over the dielectric thin film; forming the first semi-cured resin layer over the one primary surface of the semiconductor substrate and over the thin film capacitor, and a first partial electrode to be a first through-electrode, which is buried in the first resin layer and electrically connected to the first capacitor electrode or the second capacitor electrode; cutting an upper part of the first partial electrode and an upper part of the first resin layer with a cutting tool; forming a second semi-cured resin layer over one primary surface of a glass substrate with a second through-electrode buried in, and a second partial electrode to be a part of the first through-electrode, which is buried in the second resin layer and connected to the second through-electrode; cutting an upper part of the second partial electrode and an upper part of the second resin layer with the cutting tool; making thermal processing with the first resin layer and the second resin layer adhered to each other to adhere the first resin layer and the second resin layer to each other while connecting the first partial electrode and the second partial electrode to each other; removing the semiconductor substrate; forming a third resin layer over said one primary surface of the glass substrate, covering the thin film capacitor; burying a third partial electrode to be the first through-electrode in the third resin layer.

DETAILED DESCRIPTION OF THE INVENTION

A First Embodiment

The interposer according to one embodiment of the present invention and the method for manufacturing the interposer, and an electronic device using the interposer and the method for manufacturing the electronic device will be explained with reference to FIGS. 1 to 24.

(Interposer and Electronic Device)

Figure 1:
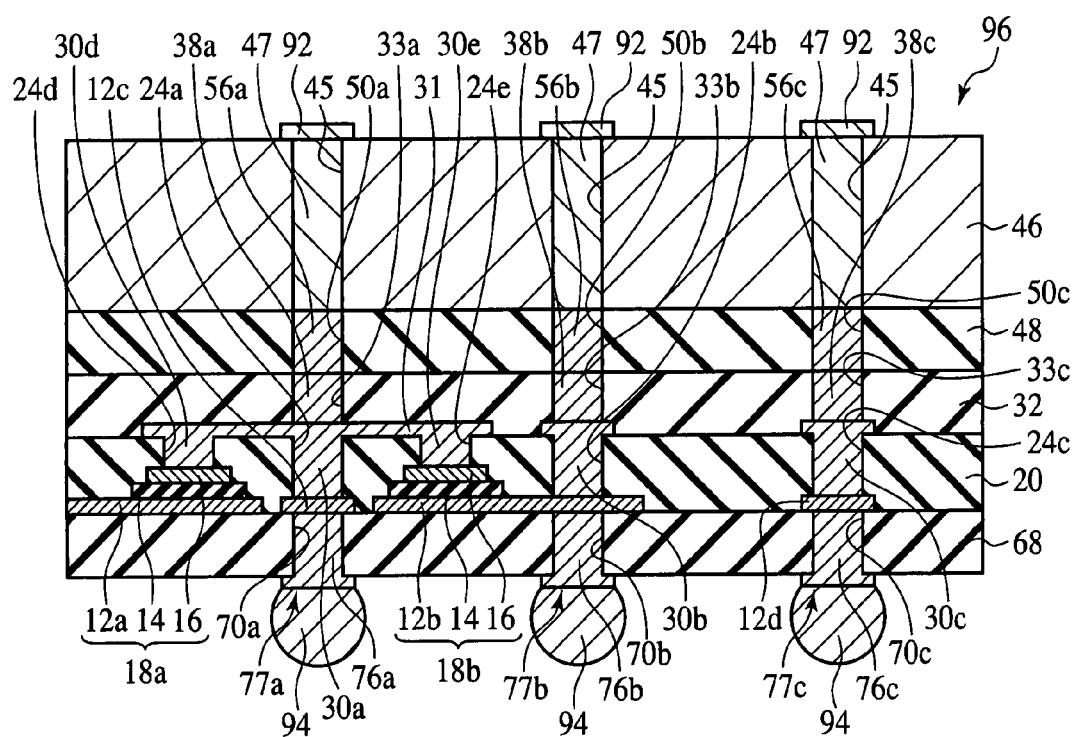
FIG. 1 is a sectional view of the interposer according to one embodiment of the present invention.
Figure 2:
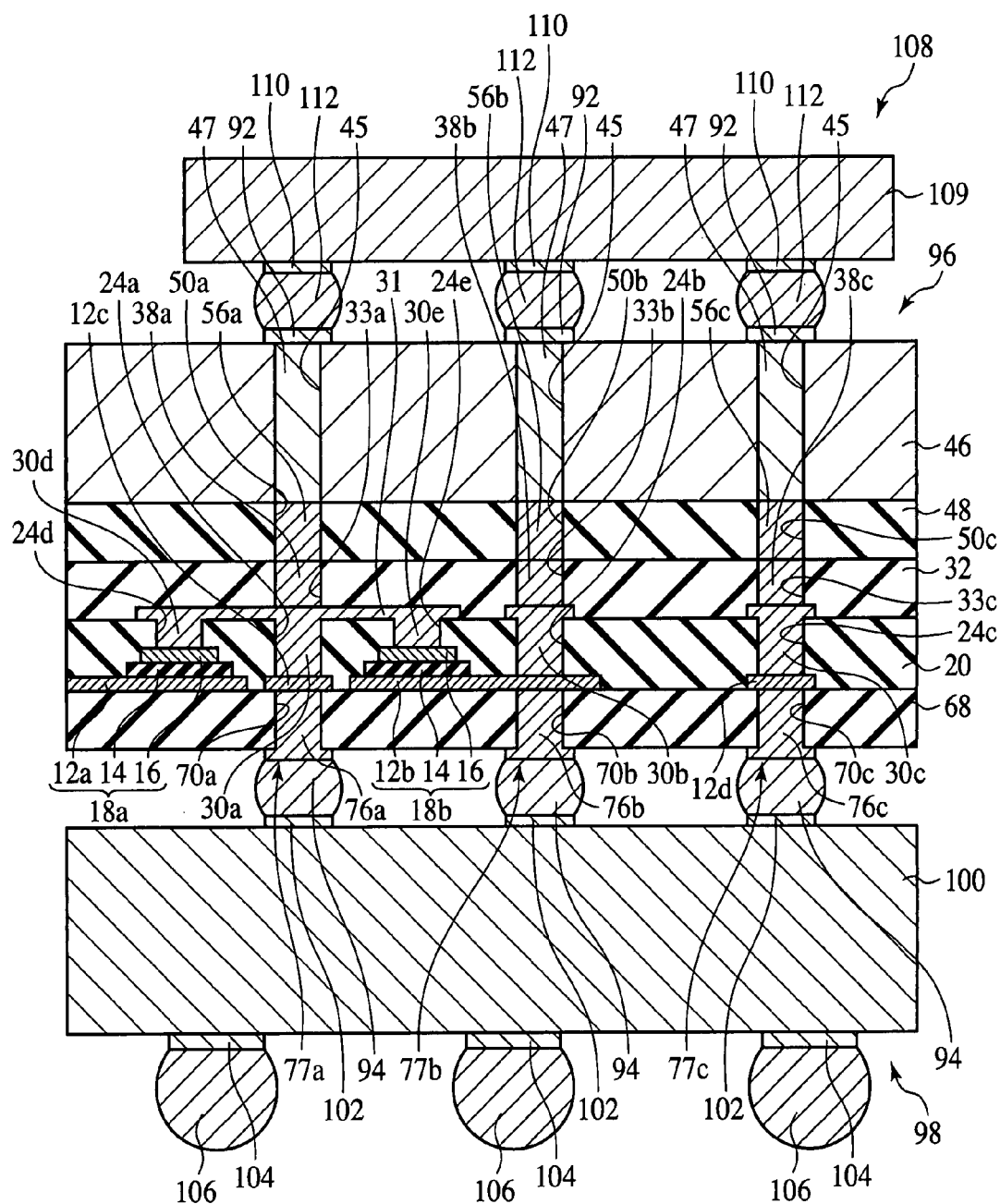
FIG. 2 is a sectional view of the electronic device according to the embodiment of the present invention.

First, the interposer and the electronic device according to the present embodiment will be explained with reference to FIGS. 1 and 2. FIG. 1 is a sectional view of the interposer according to the present embodiment. FIG. 2 is a sectional view of the electronic device according to the present embodiment.

As illustrated in FIG. 1, the interposer 96 according to the present embodiment comprises a glass substrate (support substrate) 46 with through-electrodes (vias) 47 buried in, a plurality of resin layers 68, 20, 32 supported by the glass substrate 46 with a resin layer 48 formed therebetween, thin film capacitors 18a, 18b buried in the plural resin layers 68, 20, 32, through-electrodes (vias) 77a, 77b passed through the plural resin layers 68, 20, 32 and electrically connected to the through-electrodes 47 and electrically connected to the thin film capacitors 18a, 18b, and through electrodes 77c passed through the plural resin layers 68, 20, 32, electrically connected to the through electrode 47 and insulated from the thin film capacitors 18a 18b.

On one surface of the resin layer 68, capacitor electrodes (lower electrodes) 12a, 12b are formed. As the material of the resin layer 68, epoxy resin, for example, is used. The capacitor electrodes 12a, 12b are formed of the layer film, e.g., of a 20 nm-thickness titanium oxide ($TiO_2$) film and a 150 nm-thickness platinum (Pt) film. The capacitor electrode 12a of the thin film capacitor 18a and the capacitor electrode 12b of the thin film capacitor 18b are electrically connected to each other.

On one surfaces of the capacitor electrodes 12a, 12b (opposite to the surface contacting the resin layer 68), a crystalline dielectric thin film 14 is formed. That is, a polycrystalline dielectric thin film 14 or an epitaxially grown dielectric thin film 14 is formed. The material of the dielectric thin film 14 has a highly dielectric constant. Specifically, as the material of the dielectric thin film 14, $Ba_xSr_{1-x}TiO_3$ film (hereinafter also called "BST film") is used. BST thin film provides relatively high dielectric constants (about 1500 in bulk material), and is a material effective to realize capacitors which are small and have large capacities. The film thickness of the dielectric thin film 14 is, e.g., 100 nm. The dielectric thin film 14 is formed by the process of a high temperature of, e.g., 500° C. or above. Accordingly, the dielectric thin film 14 has very good crystallinity and has a very high relative dielectric constant. Specifically, the relative dielectric constant of the dielectric thin film 14 is 200 or above.

When such dielectric thin film 14 is formed, as will be described alter, the dielectric thin film 14 is formed on the semiconductor substrate 10 which can endure high-temperature process (see FIGS. 3A to 3E). The resin layers 68, 20, 32, 48 with the thin film capacitors 18a, 18b buried in have not been subjected to the high-temperature process for forming the dielectric thin film 14 and have no large deformations, etc.

On one surface of the dielectric thin film 14 (opposite to the surface contacting the capacitor electrodes 12a, 12b), capacitor electrodes (upper electrodes) 16 are formed opposed to the capacitor electrodes 12a, 12b. The upper electrodes 16 are formed of, e.g., a 200 nm-thickness Pt film.

Thus, the thin film capacitor 18a is formed of the capacitor electrode 12a, the dielectric thin film 14 and the capacitor electrode 16. The thin film capacitor 18b is formed of the capacitor electrode 12b, the dielectric thin film 14 and the capacitor electrode 16.

On one surface of the resin layer 68 (contacting the capacitor electrodes 12a, 12b), conduction film 12c, 12d is formed of one and the same conduction film forming the capacitor electrodes 12a, 12b. The conduction film 12c forms a part of the through-electrode 77a. The conduction film 12d forms a part of the through-electrode 77c. The conduction film 12c, 12d is electrically insulated from the capacitor electrodes 12a, 12b.

In the resin layer 68, an opening 70a, an opening 70b and an opening 70c are formed respectively down to the conduction film 12c, the capacitor electrode 12b and the conduction film 12d. The openings 70a-70c are formed, corresponding to the through-electrodes 92 buried in the glass substrate 46.

In the opening 70a, a partial electrode 76a forming a part of the through-electrode 77a is buried. In the opening 70b, a partial electrode 76b forming a part of the through-electrode 77b is buried. In the opening 70c, a partial electrode 76c forming a part of the through-electrode 77c is buried.

On one surface of the resin layer 68 (contacting the capacitor electrodes 12a, 12b), a resin layer 20 is formed, covering the thin film capacitors 18a, 18b and the conduction film 12c, 12d. As the material of the resin layer 20, epoxy resin, for example, is used.

In the resin layer 20, an opening 24a, a opening 24b, an opening 24c, an opening 24d and an opening 24e are formed respectively down to the conduction film 12c, the capacitor electrode 12b of the thin film capacitor 18b, the conduction film 12d, the capacitor electrode 16 of the thin film capacitor 18a and the capacitor electrode 16 of the thin film capacitor 18b.

In the opening 24a, a partial electrode 30a forming a part of the through-electrode 77a is buried. The partial electrode 30a is connected to the partial electrode 76a via the conduction film 12c. In the opening 24b, a partial electrode 30b forming a part of the through-electrode 77b is buried. The partial electrode 30b is connected to the capacitor electrode 12b. In the opening 24c, a partial electrode 30c forming a part of the through-electrode 77c is buried. The partial electrode 30c is connected to the partial electrode 76c via the conduction film 12d.

In the opening 24d, a conductor plug 30d is buried, connected to the capacitor electrode 16 of the thin film capacitor 18a. In the opening 24e, a conductor plug 30e is buried, connected to the capacitor electrode 16 of the thin film capacitor 18b. The partial electrode 30a, the conductor plug 30d and the conductor plug 30e are electrically interconnected by an interconnection 31. The partial electrode 30a, the conductor plug 30d, the conductor plug 30e and the interconnection 31 are formed of one and the same conduction film.

On one surface of the resin layer 20 (opposite to the surface contacting the resin layer 68), a resin layer 32 is formed, covering the interconnection 31. As the resin layer 32, a thermosetting resin, which is cured and shrunk without producing by-products, such as water, alcohol, organic acid, nitrides, etc., is used. Such thermosetting resin is, e.g., a resin comprising benzocyclobutene as the main component (hereinafter also called "BCB resin") can be used. As the material of the BCB resin, for example, BCB precursor solution by Dow Chemical Company (trade name: CYCLOTEN 4024-40) or others can be used.

In the resin layer 32, an opening 33a, an opening 33b and an opening 33c are formed respectively down to the partial electrode 30a, the partial electrode 30b and the partial electrode 30c.

In the opening 33a, a partial electrode 38a forming a part of the through-electrode 77a is buried. In the opening 33b, a partial electrode 38b forming a part of the through-electrode 77b is buried. In the opening 33c, a partial electrode 38c forming a part of the through-electrode 77c is buried.

One surfaces of the partial electrodes 38a-38c (opposite to the surfaces contacting the partial electrodes 30a-30c) and one surface of the resin layer 32 (opposite to the surface contacting the resin layer 20) are cut by a cutting tool 44 of diamond or others (see FIG. 7B) as will be described later. One surfaces of the partial electrodes 38a-38c (contacting the partial electrodes 56a-56c) and one surface of the resin layer 32 (contacting the resin layer 48) which are cut with the cutting tool 44 of diamond or others are flat.

On the side of one surface of the resin layer 32 (opposite to the surface contacting the resin layer 20), a glass substrate 46 is provided, spaced from the resin layer 32. A plurality of through-holes 45 are formed in the glass substrate 46, and through-electrodes 47 are buried in the respective through-holes 45. The diameter of the through-holes 45 is, e.g., about 100-400 μm. The pitch of the through-electrodes 47 is, e.g., about 300 μm. The thickness of the glass substrate 46 is, e.g., about 200-600 μm. The thickness of the glass substrate 46 is 400 μm here. The glass material forming the glass substrate 46 is preferably a glass material of high heat resistance. For example, borosilicate glass with boron oxide added so as to lower the softening point of quartz glass and make the thermal expansion coefficient smaller is preferably used for the glass substrate 46. Such borosilicate glass is a good glass material which can endure abrupt heating and abrupt cooling. Such borosilicate glass is exemplified by PYREX (registered trademark) glass. As the material of the through-electrodes 47, FeNiCo (iron-nickel-cobalt) alloy, for example, is used. As such glass substrate 46, the glass substrate manufactured by, e.g., TECNISCO LIMITED can be used.

The through-holes 45 can be formed in the glass substrate 46 by drill processing, sand blast processing, supersonic processing or others. Accordingly, the through-holes can be formed in the glass substrate 46 at very low cost. On the other hand, it cannot help using dry etching or others so as to form through-holes in the semiconductor substrate, etc. It takes a very long time and high cost to form through-holes in the semiconductor substrate by dry etching.

Because the glass substrate 46 is insulator, it is not necessary to form an insulation film on the inside walls of the through-holes 45 in the glass substrate 46 for insulating the through-holes 47 from each other. On the other hand, when the through-holes are buried in a semiconductor substrate, it is necessary to form an insulation film for insulating the through-holes from each other on the inside walls of the through-holes by thermal oxidation, CVD or others.

The transmission loss of the glass substrate 46 with the through-electrodes 47 buried in is very low in comparison with the transmission loss of a semiconductor substrate with the through-electrodes buried in (see Non-Patent Reference 1).

Thus, the glass substrate 46 with the through-holes 47 buried in causes lower cost in comparison with the semiconductor substrate with the through-electrodes buried in and has good electric characteristics. For this reason, in the present embodiment, the glass substrate 46 with the through-electrodes 47 buried in is used.

A resin layer 48 is formed on one surface of the glass substrate 46 (opposed to the resin layer 32). As the resin layer 48 as well as the resin layer 32, a thermosetting resin, which is cured and shrunk without producing by-products, such as water, alcohol, organic acid, nitrides, etc., is used. As such thermosetting resin, BCB resin, for example, is used, as is the resin layer 32. As the material of such BCB resin, BCB precursor solution (trade name: CYCLOTEN 4024-40) by Dow Chemical Company or others can be used.

In the resin layer 48, openings 50a, 50b, 50c are formed corresponding to the through-holes 47 buried in the glass substrate 46.

A partial electrode 56a is buried in the opening 50a. The partial electrodes 56a electrically interconnect the through-electrode 47 buried in the glass substrate 46, and the through-holes 56a passed through the resin layers 68, 20, 32. A partial electrode 56b is buried in the opening 50b. The partial electrodes 56b electrically interconnects the through-electrodes 47 buried in the glass substrate 46, and the through-electrode 56b buried in the resin layers 68, 20, 32. A partial electrode 56c is buried in the openings 50c. The partial electrodes 56c electrically interconnects the through-electrode 47 buried in the glass substrate 46, and the through electrodes 56c passed through the resin layers 68, 20, 32.

Figure 12A:
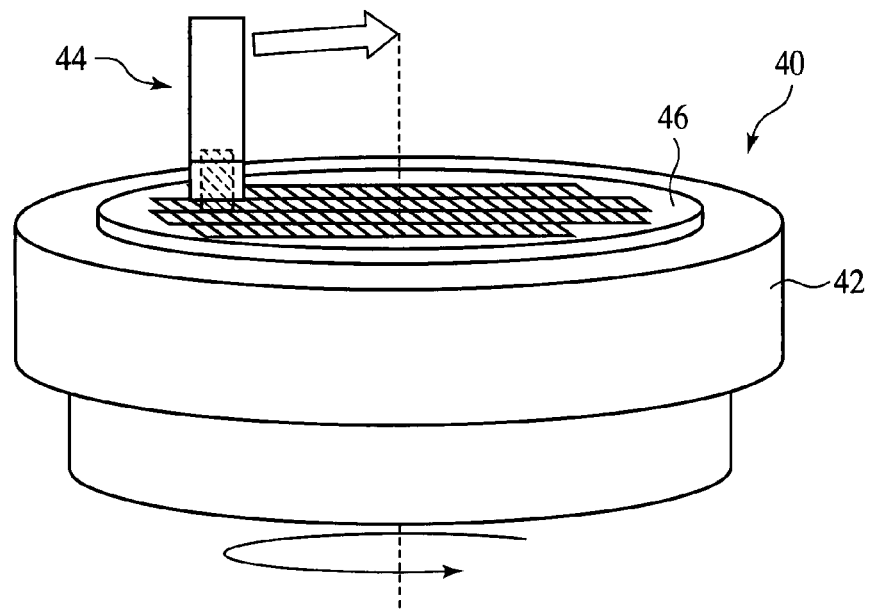
FIGS. 12A and 12B are views illustrating the steps of the method for manufacturing the interposer and the electronic device according to the embodiment of the present invention (Part 10).
Figure 12B:
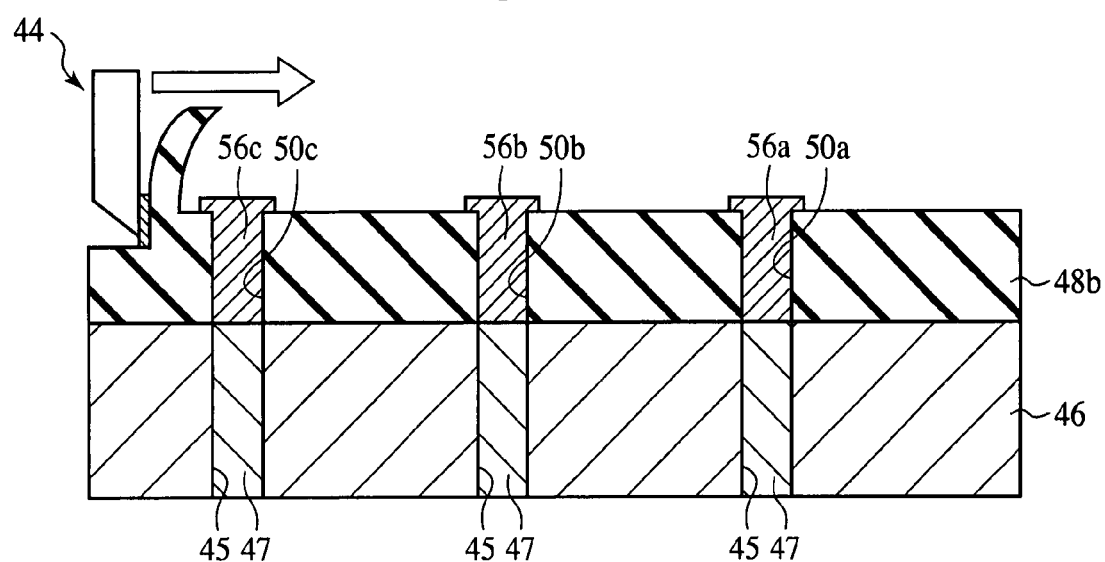

One surfaces of the partial electrodes 56a-56c (contacting the partial electrodes 38a-38c) and one surface of the resin layer 48 (contacting the resin layer 32) are cut with the cutting tool 44 of diamond or others (see FIG. 12B). One surfaces of the partial electrodes 56a-56c (contacting the partial electrodes 38a-38c) and one surface of the resin layer 48 (contacting the resin layer 32), which have been cut with the cutting tool 44, are flat.

BCB resin is cured by bonding cyclobutene ring-opened by heat, and dienophile containing unsaturated bonds being bonded to each other by Diels-Alder reaction. When thermally ring-opened cyclobutene rings and dienophile containing unsaturated bonds are bonded to each other by Diels-Alder reaction, no polar functional group is involved. Accordingly, BCB resin can be cured without making no byproduct, such as water, alcohol, etc. and no voids are formed in BCB resin due to the evaporation of such byproducts. The solvent residing in BCB resin is evaporated in advance by thermal processing, whereby no voids are formed either due to the evaporation of the solvent. BCB resin can be cured without causing voids, which ensures the cure and shrink while preventing the volume increase due to the voids.

The resin layer 32 and the resin layer 48 are adhered to each other. The partial electrodes 38a-38c buried in the resin layer 32 and the partial electrodes 56a-56c buried in the resin layer 48 are connected to each other. As will be described later, the resin layer 32 and the resin layer 48 are subjected to thermal processing for shrinking the resin layer 32 and the resin layer 48. The resin layer 32 and the resin layer 48, which have been surely adhered to each other, shrink, whereby one surfaces of the partial electrodes 38a-38c (contacting the partial electrodes 56a-56c) and one surfaces of the partial electrodes 56a-56c (contacting the partial electrodes 38a-38c) are connected firm to each due to the shrinkage of the resin layer 32 and the resin layer 48.

The partial electrode 76a, the conduction film 12c, the partial electrode 30a and the partial electrode 38a form the through-electrode 77a. The partial electrode 76b, a part of the capacitor electrode 12b, the partial electrode 30b and the partial electrode 38b form the through-electrode 77b. The partial electrode 76c, the conduction film 12d, the partial electrode 30c and the partial electrode 38c form the through-electrode 77c.

The through-electrodes 77a-77c are connected, via the partial electrodes 56a-56c, respectively to a plurality of through-electrodes 47 buried in the glass substrate 46.

Electrode pads 92 are formed on one surfaces of the through-electrodes 47 (opposite to the surface contacting the partial electrodes 56a-56c).

Solder bumps 94 of, e.g., Sn-based solder are formed on one surfaces of the through-electrodes 77a-77c (opposite to the surface contacting the through-electrodes 45).

Thus, the interposer 96 according to the present embodiment is constituted.

FIG. 2 is a sectional view of an electronic device using the interposer according to the present embodiment.

As illustrated in FIG. 2, the interposer 96 according to the present embodiment is disposed e.g., between the package substrate 98 and the semiconductor integrated circuit element 108.

The package substrate 98 includes a substrate 100 with a multilayer interconnections (not illustrated) buried in, electrode pads 102 formed on formed on one primary surface of the substrate 100 (opposed to the interposer 96), electrode pads 104 formed on the other primary surface of the substrate 100 (opposite to the surface opposed to the interposer 96), and solder bumps 106 formed on one surfaces of the electrode pads 104 (opposite to the surface contacting the substrate 100). Each electrode pad 102 is electrically connected to one (not illustrated) of the multilayer interconnections buried in the substrate 100. Each electrode pad 104 is electrically connected to one (not illustrated) of the multilayer interconnections buried in the substrate 100.

The through-electrodes 77a-77c of the interposer 96 and the electrode pads 102 of the package substrate 98 are electrically connected to each other by the solder bumps 94.

The semiconductor integrated circuit element 108 includes a semiconductor substrate 109, and electrode pads 110 formed on one primary surface of the semiconductor substrate 109 (opposed to the interposer 96). As the semiconductor substrate 109, a silicon substrate, for example, is sued. An integrated circuit (not illustrated) including electronic circuit elements (not illustrated) is formed on one primary surface of the semiconductor substrate 109 (opposed to the interposer 96). That is, on one primary surface of the semiconductor substrate 109 (opposed to the interposer 96), active elements (not illustrated), such as transistors, etc. and/or passive elements (not illustrated), such as capacitor elements are arranged. On one primary surface of the semiconductor substrate 109 (opposed to the interposer 96) with such electronic circuit elements formed on, a multilayer interconnection structure (not illustrated) including a plurality of inter-layer insulation films (not illustrated) and interconnection layers (not illustrated) is formed. The multilayer interconnection layer electrically interconnects the electronic circuit elements (not illustrated). Each electrode pad 110 is connected to one of the interconnections formed in a plurality of layers.

The electrode pads 110 of the semiconductor integrated circuit elements 108 and the electrode pads 92 of the interposer 96 are electrically connected to each other by the solder bumps 112.

Thus, the electronic device using the interposer according to the present embodiment is constituted.

According to the present embodiment, as will be described later, the thin film capacitors 18a, 18b are formed on the semiconductor substrate 10 of high heat resistance, which permits the dielectric thin film 14 having a 200 or above relative dielectric constant and good crystallinity. Thus, according to the present embodiment, the thin film capacitors 18a, 18b can have very good electric characteristics. Furthermore, according to the present embodiment, as will be described later, the semiconductor substrate 10 through which it is difficult to form through-holes is removed, which makes it unnecessary to form the through-holes for the through-electrodes 70a-70c to be buried in the semiconductor substrate 10. The glass substrate 46 with the through-electrodes 47 buried in can be relatively easily produced, and costs much less in comparison with burying the through-electrodes in the semiconductor substrate 10. Thus, according to the present embodiment, the interposer 96 including the thin film capacitors 18a, 18b of very high capacitance can be provided at low costs.

(The Method for Manufacturing the Interposer and the Electronic Device)

Next, the method for manufacturing the interposer and the electronic device according to the present embodiment will be explained with reference to FIGS. 3A to 24. FIGS. 3A to 24 are views of the interposer and the electronic device according to the present embodiment in the steps of the method for manufacturing the same. FIG. 3A to 6C, FIGS. 7B to 11C and FIGS. 12B to 24 are sectional views. FIG. 7A and FIG. 12A are perspective views.

Figure 3A:
FIGS. 3A to 3E are views illustrating the steps of the method for manufacturing the interposer and the electronic device according to the embodiment of the present invention (Part 1).

As illustrated in FIG. 3A, the semiconductor substrate 10 is prepared. The semiconductor substrate 10 is not diced in a chip size, that is, the semiconductor substrate is prepared in a wafer. The semiconductor substrate 10 is, e.g., a silicon substrate. The thickness of the semiconductor substrate 10 is, e.g., 0.6 mm.

Next, silicon oxide film (not illustrated) is formed on the surface of the semiconductor substrate 10 by thermal oxidation. The film thickness of the silicon oxide film is, e.g., about 0.3 μm.

Figure 3B:
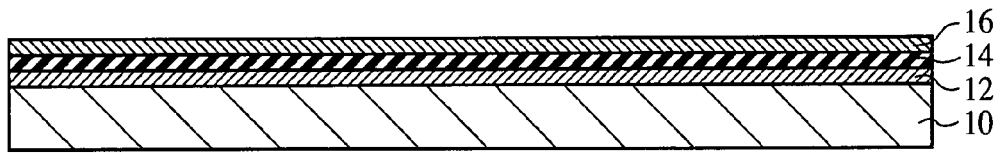
Figure 3C:
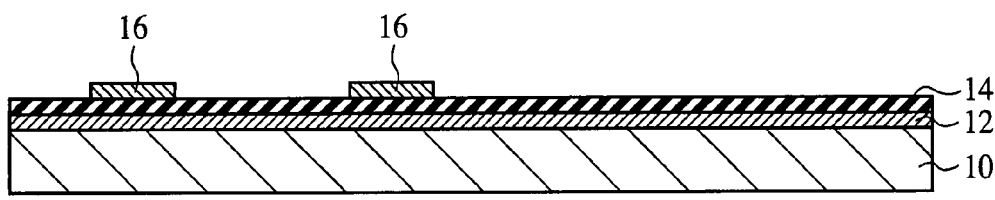

Next, as illustrated in FIG. 3B, the conduction film 12 of titanium oxide ($TiO_2$) film and platinum (Pt) film are sequentially laid on the semiconductor substrate 10 by, e.g., sputtering is formed. The conduction film 12 is to be the lower electrodes (capacitor electrodes) 12a, 12b of the thin film capacitors 18a, 18b. The film thickness of the titanium oxide film is, e.g., 20 nm. The film thickness of the Pt film is, e.g., 150 nm.

The conditions for forming the titanium oxide film are as exemplified below. The substrate temperature is, e.g., 500° C. The RF power is, e.g., 200 W. The gas pressure inside the film forming chamber is, e.g., 0.1 Pa. The flow rate ratio of argon (Ar) gas and oxygen ($O_2$) gas is, e.g., 7:2.

The conditions for forming the Pt film are as exemplified below. The substrate temperature is, e.g., 400° C. The DC power is, e.g., 100 W. The pressure of the Ar gas is, e.g., 0.1 Pa.

Next, the crystalline dielectric thin film 14 is formed on the conduction film 12 by, e.g., sputtering. The dielectric thin film 14 is, e.g., $Ba_XSr_{1-X}TiO_3$ (BST) film 14. To be more specific, polycrystalline BST film is formed as the dielectric thin film 14. BST can provide relatively large relative dielectric constant (about 1500 in bulk material) and is a material effective to realize small capacitors of large capacitance. The film thickness of the dielectric thin film 14 is, e.g., 100 nm.

The conditions for forming the dielectric thin film 14 of BST are as exemplified below. The substrate temperature is, e.g., 600° C. The gas pressure inside the film forming chamber is, e.g., 0.2 Pa. The flow rate ratio of the argon gas and oxygen gas is, e.g., 8:1. The applied electric power is, e.g., 600 W. The film forming period of time is, e.g., 30 minutes. When the dielectric thin film 14 of BST is formed under these conditions, the dielectric thin film 14 can have good electric characteristics of a relative dielectric constant of about 400 and a dielectric loss of 1% or below.

As the dielectric thin film 14, BST film is formed here. However, the material of the dielectric thin film 14 is not limited to BST and can be formed suitably of a highly dielectric material.

The polycrystalline dielectric thin film 14 is formed here, but the dielectric thin film 14 may be epitaxially grown. The conduction film 12 to be the lower electrodes is epitaxially grown on the semiconductor substrate 10, and the dielectric film 14 is epitaxially grown on the conduction film 12, whereby the dielectric thin film 14 of a uniform crystal orientation can be formed.

The relative dielectric constant of the dielectric thin film 14 is not limited to about 400. However, to realize required electric characteristics, it is preferable that the relative dielectric constant of the dielectric thin film 14 is sufficiently large. In the present embodiment, the dielectric thin film 14 is formed on the semiconductor substrate 10 of high heat resistance, which allows the dielectric thin film 14 to be formed by the process of a high temperature of, e.g., 500° C. or above.

The dielectric thin film 14 thus formed by the process of such high temperature can have a relative dielectric constant of 200 or above.

The dielectric thin film 14 is formed by sputtering here but may be formed by sol-gel process. When the dielectric thin film 14 is formed by sol-gel process, the dielectric thin film 14 is formed as exemplified below.

That is, first, a starting solution of alkoxide is applied to the conduction film 12 by spin coating. As the starting solution, a starting solution for forming, e.g., BST film is used. The film forming conditions are, e.g., 2000 rpm and 30 seconds. Thus, the dielectric thin film 14 of, e.g., an about 100 nm-thickness is formed.

Next, pre-sintering is made on the dielectric thin film 14. The pre-sintering is for evaporating organic substances, water, etc. produced by the hydrolytic reaction of the starting solution. The conditions for the pre-sintering are, e.g., 400° C. and 10 minutes.

Next, main sintering is made on the dielectric thin film 14. The main sintering is for sufficiently crystallizing the dielectric thin film 14. The conditions for the main sintering are, e.g., 700° C. and 10 minutes. The film thickness of the dielectric thin film 14 subjected to the main sintering is, e.g., about 100 nm.

The dielectric thin film 14 formed of BST under these conditions can have the electric characteristics of an about 300 relative dielectric constant and a 2% or below dielectric loss.

Thus, the dielectric thin film 14 may be formed by sol-gel process.

Next, the conduction film 16 of, e.g., Pt is formed on the dielectric thin film 14 by, e.g., sputtering. The conduction film 16 is to be the upper electrodes (capacitor electrodes) of the capacitors 18a, 18b. The film thickness of the conduction film 16 is, e.g., 200 nm.

Next, the conduction film 16 is patterned into prescribed configurations by photolithography. When etching the conduction film 16, Ar ion milling, for example, can be used. Thus, the upper electrodes (capacitor electrodes) 16 of the conduction film are formed (see FIG. 3c).

Figure 3D:
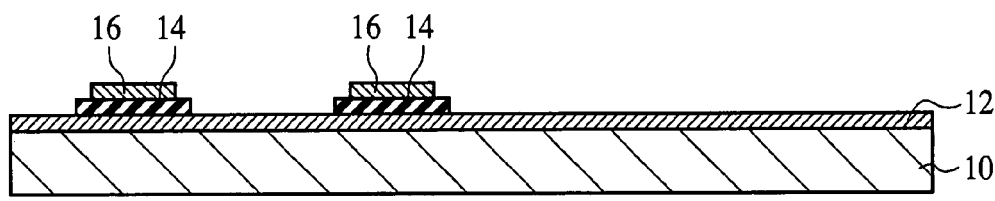
Figure 3E:
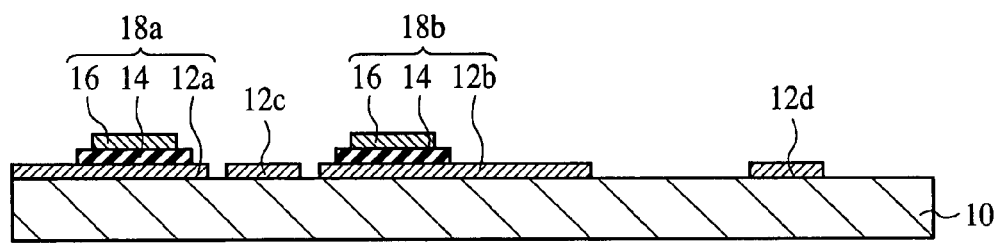

Next, the dielectric thin film 14 is patterned into the prescribed configurations by photolithography (see FIG. 3D). The dielectric thin film 14 can be etched by, e.g., Ar ion milling.

Next, the conduction film 12 is patterned into prescribed shape configurations by photolithography. Thus, the capacitor electrodes 12a, 12b and the conduction films 12c, 12d of the conduction film 12 are formed (see FIG. 3E). In patterning the conduction film 12, the conduction film 12 is patterned so that the capacitor electrode 12a and the capacitor electrode 12b are electrically connected to each other. In patterning the conduction film 12, the conduction film 12 is patterned so that the conduction films 12c, 12d are electrically separated from the capacitor electrode 12a, 12b. Thus, the capacitor 18a including the capacitor electrode 12a, the dielectric thin film 14 and the capacitor electrode 16 is formed, and the thin film capacitor 18b including the capacitor electrode 12b, the dielectric thin film 14 and the capacitor electrode 16 is formed.

Figure 4A:
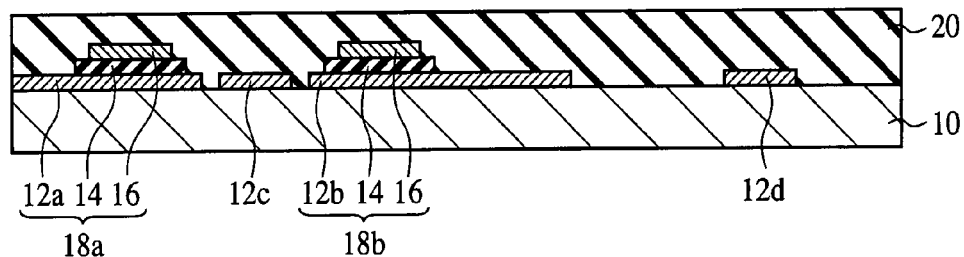
FIGS. 4A to 4D are views illustrating the steps of the method for manufacturing the interposer and the electronic device according to the embodiment of the present invention (Part 2).

Next, the resin layer 20 is formed on the semiconductor substrate 10 with the thin film capacitors 18a, 18b and the conduction film 12a, 12b formed on (see FIG. 4A). As the material of the resin layer 20, a photosensitive epoxy resin, for example, is used.

Such resin layer 20 can be formed as exemplified below. A photosensitive epoxy resin solution is applied to the semiconductor substrate 10. The conditions for applying the epoxy resin solution are, e.g., 2000 rpm and 30 seconds. Thus, the resin layer 20 of, e.g., a 6 μm-thickness is formed. Then, thermal processing (pre-baking) is made on the resin layer 20. The thermal processing temperature is, e.g., 60° C.

Figure 4B:
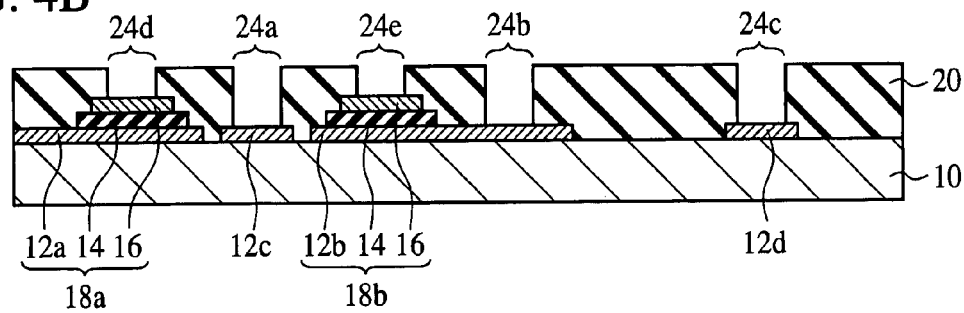

Then, the openings 24a-24e are formed in the resin layer 20 by photolithography (see FIG. 4B). The opening 24a is for burying the partial electrode 30a to be a part of the through-electrode 77a (see FIG. 4C) and is formed down to the conduction film 12c. The openings 24b is for burying the partial electrode 30b to be a part of the through-electrode 77b (see FIG. 4C) and is formed down to the capacitor electrode 12b. The openings 24c are for burying the partial electrode 30c to be a part of the through-electrode 77c (see FIG. 4C) and is formed down to the conduction film 12d. The opening 24d is for burying the conduction plug 30d and is formed down to the capacitor electrode 16 of the capacitor 18a. The opening 24e is for burying the conductor plug 30e and is formed down to the capacitor electrode 16 of the capacitor 18b.

The openings 24a-24c are for burying the partial electrodes 30a-30c to be parts of the through-electrodes 77a-77c (see FIG. 1) and are to be connected to the through-electrodes 47 buried in the glass substrate 46 (see FIG. 1). Accordingly, the openings 24a-24c are formed corresponding to the through-electrodes 47 buried in the glass substrate 46.

Next, thermal processing (main bake) is made on the resin layer 20. The thermal processing temperature is, e.g., 200° C. The film thickness of the resin layer 20 subjected to the thermal processing is, e.g., about 3 μm.

Then, a seed layer (not illustrated) of Cr film and Cu film sequentially laid is formed on the entire surface by, e.g., sputtering.

Next, a photoresist film 26 is formed on the entire surface by spin coating.

Figure 4C:
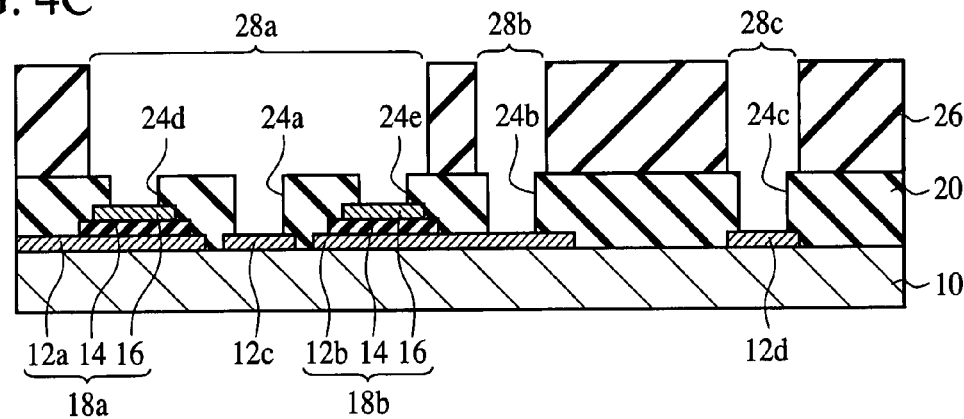
Figure 4D:
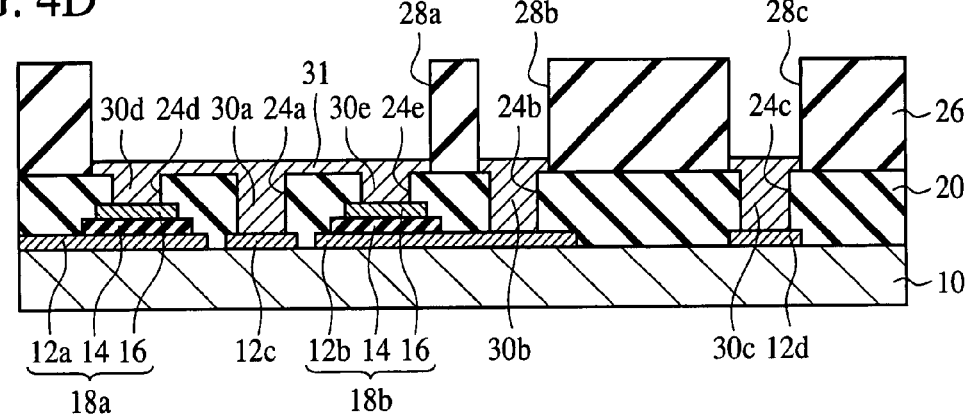

Next, the openings 28a-28c are formed in the photoresist film 26 by photolithography (see FIG. 4C). The opening 28a is for forming the partial electrode 30a, the conductor plug 30d, the conductor plug 30e and the interconnection 31. The opening 28b is for forming the partial electrode 30b. The opening 28c is for forming the partial electrode 30c.

Then, a plated film of, e.g., Cu is formed in the openings 24a-24e and the openings 28a-28c by electroplating. The thickness of the plated film is, e.g., about 3 μm. Thus, the partial electrode 30a, the conductor plugs 30d, 30e and the interconnection 31 of the plated film are formed in the openings 24a, 24d, 24e and the opening 28a. In the opening 24b and the opening 28b, the partial electrode 30b of the plated film is formed. In the opening 24c and the opening 28c, the partial electrode 30c of the plated film is formed (see FIG. 4D).

Figure 5A:
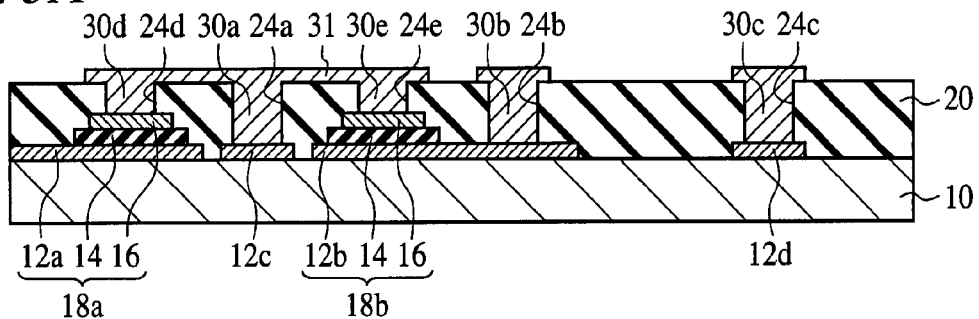
FIGS. 5A to 5D are views illustrating the steps of the method for manufacturing the interposer and the electronic device according to the embodiment of the present invention (Part 3).

Next, the photoresist film 26 is released (see FIG. 5A).

Then, the exposed seed layer (not illustrated) is removed by wet etching. The etchant is, e.g., about 1-10% ammonium persulfate aqueous solution. The etching period of time is, e.g., about 2 minutes. When the seed layer is etched off, the surfaces of the partial electrodes 30a-30c, the conduction plugs 30d, 30e and the interconnection 31 are a little etched, but the seed layer whose thickness is sufficiently smaller than the size of the partial electrodes 30a-30c, the conduction plugs 30d, 30e and the interconnection 31 can be etched in a short period of time. The partial electrodes 30a-30c, the conduction plug 30d, the conduction plug 30e, and the interconnection 31 are never excessively etched.

Figure 5B:
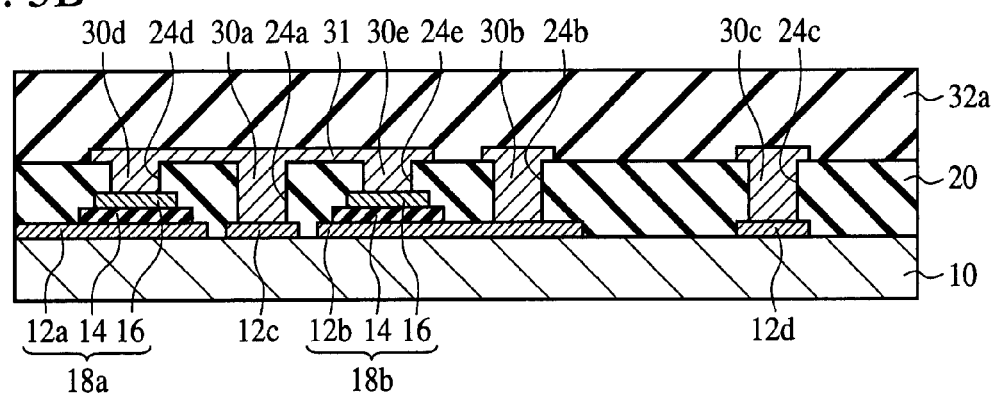

Next, the resin layer 32a is formed on the entire surface by, e.g., spin coating (see FIG. 5B). The film thickness of the resin layer 32a is, e.g., about 5 μm. The resin layer 32a is formed of, e.g., photosensitive BCB (benzocyclobutene) resin. As the material of such BCB resin, BCB precursor solution by Dow Chemical Company (trade name: CYCLOTENE 4024-40) or others. Such BCB resin is a thermosetting resin having the curing property that the BCB resin is liquid before being subjected to thermal processing, is semi-cured by further thermal processing and is completely cured by further thermal processing. The conditions for the thermal processing for semi-curing such BCB resin are 180° C. and about 1 hour, the conditions for the thermal processing for completely curing the BCB resin are 250° C. and about 1 hour. The viscosity of such BCB resin is about 350 cSt at 25° C. The conditions for applying the resin layer 32a of BCB resin is, e.g., 2000 rpm and 30 seconds.

Thus, the resin layer 32a is formed on the resin layer 20 with the partial electrodes 30a-30c, the conduction plug 30d, the conduction plug 30e, and the interconnection 31 formed on. The resin layer 32a immediately after applied is not yet subjected to thermal processing and is liquid.

Figure 5C:
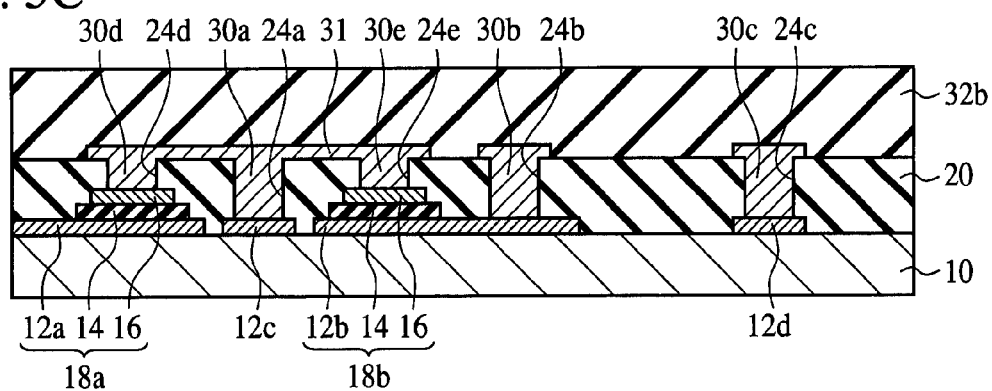

Then, the thermal processing for semi-curing the resin layer 32a is made, and the resin layer 32a which has not been cured is semi-cured into the resin layer 32b (see FIG. 5C). The cure percentage of the resin layer 32b is preferably 40-80%. The cure percentage of the resin layer 32b is 50-60% here. The thermal processing temperature is, e.g., 150° C., and the thermal processing period of time is, e.g., about 1 hour. The atmosphere for making the thermal processing is, e.g., $N_2$ atmosphere.

The thermal processing conditions are not limited to the above and can be suitably set. For example, when the thermal processing temperature is set a little high, the thermal processing period of time may set shorter. When the thermal processing temperature is set a little lower, the thermal processing temperature may be set longer.

However, it is preferable that the thermal processing temperature is set a temperature higher than the boiling point of a solvent of the BCB resin solution. That is, when the thermal processing is made at a temperature lower than the boiling point of the solvent of the BCB resin solution, the solvent of the BCB resin solution resides in the resin layer 32b. In this case, the solvent residing in the resin layer 32b is evaporated in thermal processing in a later step. In the thermal processing in the later step, the thermal processing is made with the resin layer 32b and the resin layer 48b are laid the latter on the former (see FIG. 16B), the evaporated solvent is confined in the resin layer 32b. When the solvent is confined in the resin layer 32b, voids are formed in the resin layer 32b. To prevent the formation of voids in the resin layer 32b by the thermal processing in the later step, it is preferable to set the thermal processing temperature at a temperature higher than the boiling point of the solvent of the BCB resin solution.

Figure 5D:
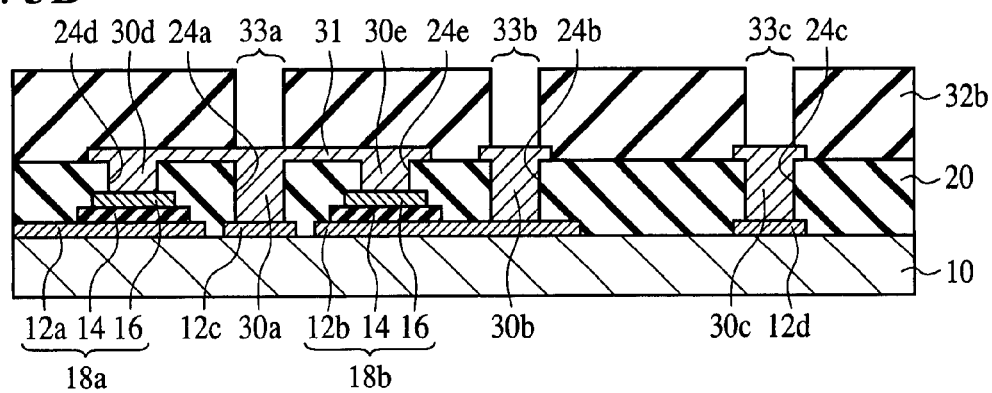

Then, the openings 33a-33c are formed in the resin layer 32b by photolithography (see FIG. 5D). The opening 33a is for burying the partial electrode 38a to be a part of the through-electrode 77a, and is formed down to the partial electrode 30a. The opening 33b is for burying the partial electrode 38b to be a part of the through-electrode 77b and is formed down to the partial electrode 30b. The opening 33c is for burying the partial electrode 38c to be a part of the through-electrode 77c and is formed down to the partial electrode 30c.

Next, the seed layer (not illustrated) of Cr film and Cu film sequentially laid is formed on the entire surface by, e.g., sputtering.

Next, a photoresist film 34 is formed on the entire surface by spin coating.

Figure 6A:
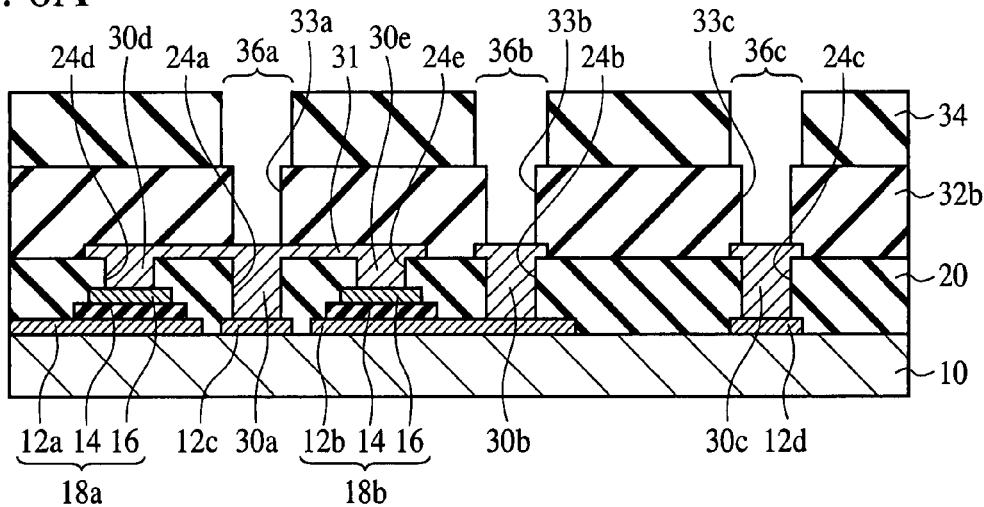
FIGS. 6A to 6C are views illustrating the steps of the method for manufacturing the interposer and the electronic device according to the embodiment of the present invention (Part 4).
Figure 6B:
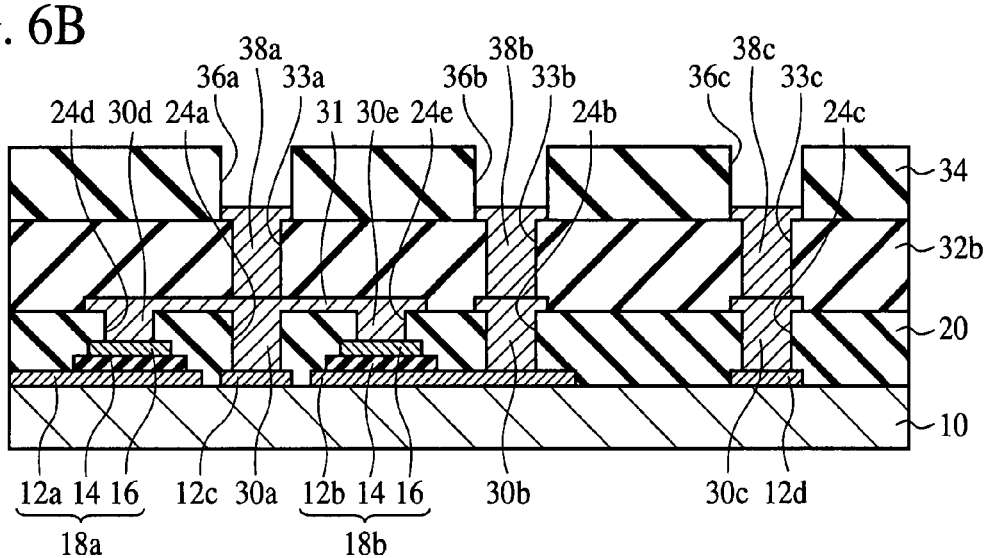
Figure 7A:
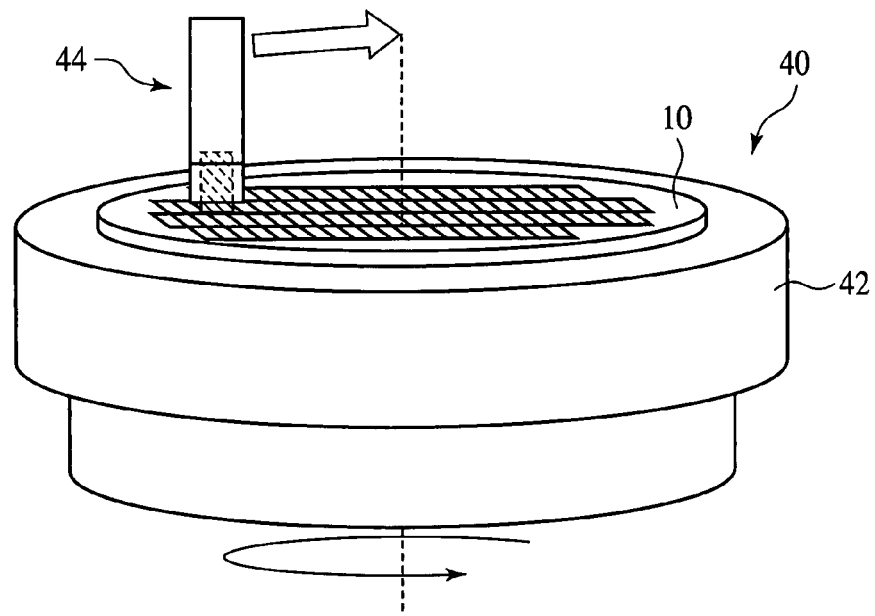
FIGS. 7A and 7B are views illustrating the steps of the method for manufacturing the interposer and the electronic device according to the embodiment of the present invention (Part 5).

Next, the openings 36a-36c are formed in the photoresist film 34 by photolithography (see FIG. 6A). The opening 36a is formed forming the partial electrode 38a. The opening 36b is for forming the partial electrode 38b. The opening 36c is for forming the partial electrode 38c.

Next, a plated film of, e.g., Cu is formed in the openings 33a-33c and the openings 36a-36c by electroplating. The thickness of the plated film is, e.g., about 6 μm. Thus, the partial electrodes 38a-38c of the plated film are formed in the openings 33a-33c and the openings 36a-36c (see FIG. 6B).

Figure 6C:
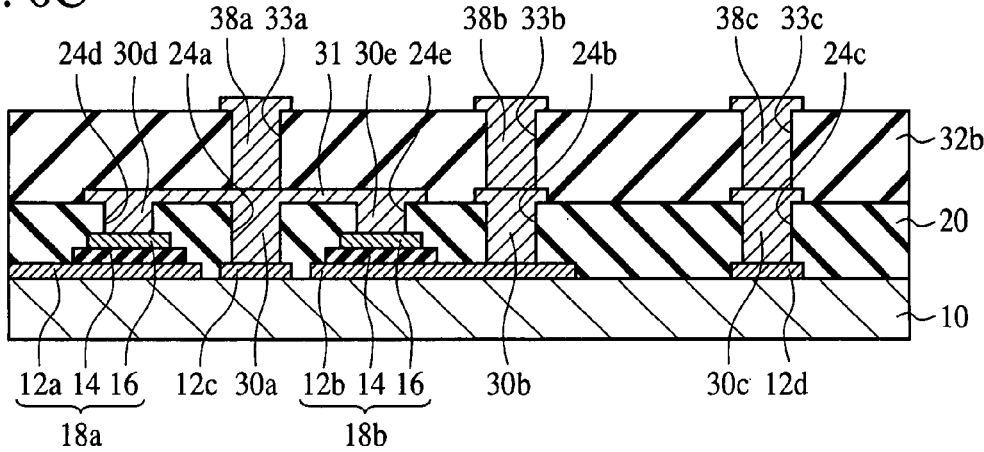

Next, the photoresist film 34 is released (see FIG. 6C).

Then, the exposed seed layer (not illustrated) is removed by wet etching. The etchant is, e.g., about 1-10% ammonium persulfate aqueous solution. The etching period of time is, e.g., about 2 minutes. When the seed layer is etched off, the surfaces of the partial electrodes 38a-38c are also etched a little. However, the seed layer whose thickness is sufficiently smaller than the size of the partial electrodes 38a-38c can be etched in a short period of time, and the partial electrodes 38a-38c are never excessively etched.

Then, as illustrated in FIG. 7A, the semiconductor substrate 10 is fixed onto a chuck table 42 of an ultraprecise lathe 40 by vacuum suction.

FIG. 7A is a perspective view of the semiconductor substrate fixed to the ultraprecise lathe. The semiconductor substrate 10 is mounted on the chuck table 42 with the underside of the semiconductor substrate 10, i.e., the surface where the partial electrodes 38a-38c, etc. are not formed fixed to the chuck table 42.

The chuck table 42 is for securing an object-to-be-processed, such as the substrate or others in machining the substrate or others.

To secure the semiconductor substrate 10 to the chuck table 42, a pin chuck is preferably used.

Figure 7B:
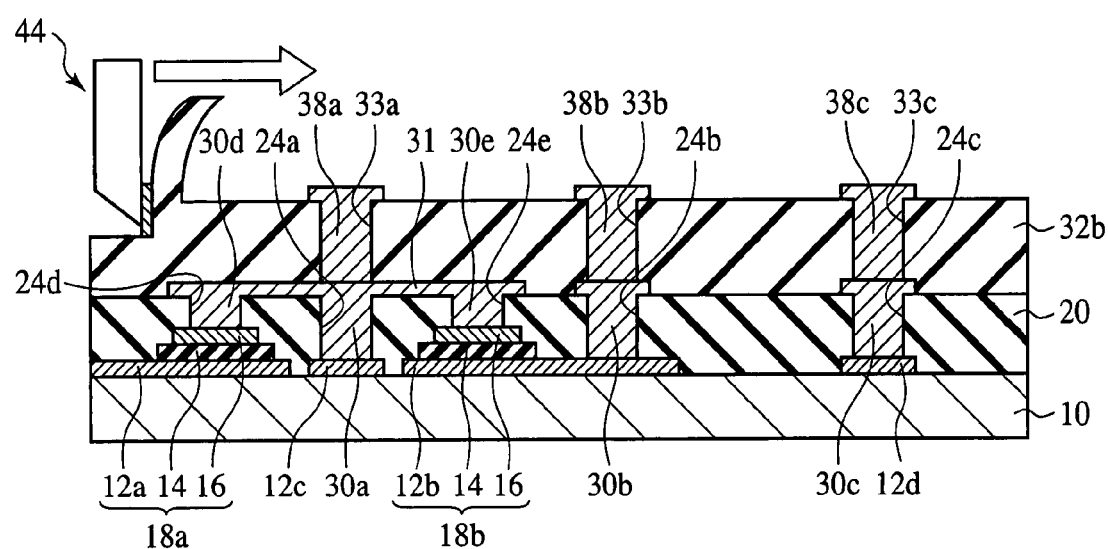

Then, with the semiconductor substrate 10 set on rotation, the upper parts of the partial electrodes 38a-38c and the upper part of the resin layer 32b are cut with a cutting tool 44 of diamond (see FIG. 7A and FIG. 7B). At this time, rough cut is made until the thickness of the resin layer 32b is reduced to about 2 μm.

The conditions for rough cutting the upper part of the partial electrodes 38a-38c and the upper part of the resin layer 32b are as exemplified below.

The rake angle of the cutting tool 44 is, e.g., 0 degree. The rake angle is an angle formed by a plane perpendicular to the cut surface of an object-to-be-cut, and the forward surface (rake surface) of the cutting tool blade in the direction of advance of the cutting tool blade. Generally, as the rake is larger, the cut is better, but the cutting tool blade is more damaged, and the life of the cutting tool blade tends to become shorter.

The rotation number of the chuck table 42 is, e.g., about 2000 rpm. In this case, the cut speed is, e.g., about 20 m/second.

The cut amount of the bit 44 is, e.g., about 2-3 μm. The cut amount is a rake depth of cut of the cutting tool 44.

The feed of the cutting tool 44 is, e.g., about 2-3 μm. The feed is an advance speed of the cutting tool in the radial direction of the chuck table 42 (i.e., the direction interconnection one point on the outer edge of the chuck table 42 and the rotation center).

When the upper parts of the partial electrodes 38a-38c and the upper part of the resin layer 32b are cut with the cutting tool 44, some large force is applied to the partial electrodes 38a-38c and the resin layer 32b by the cutting tool 44. When the upper part of the resin layer 32b is cut, the force is applied not only horizontally to one surface of the resin layer 32b (opposite to the surface contacting the resin layer 20) but also perpendicularly to one surface of the resin layer 32b (opposite to the surface contacting the resin layer 20). Accordingly, while the resin layer 32b is being somewhat compression deformed, the resin layer 32b is cut. The resin layer 32b which has been compression deformed by the cutting tool 44 is somewhat recovered after cut. On the other hand, the partial electrodes 38a-38c, which are formed of metal, such as Cu or others, are not substantially deformed during the cut. Accordingly, one surface of the resin layer 32b after cut (opposite to the surface contacting the resin layer 20) is higher than one surfaces of the partial electrodes 38a-38c after cut (opposite to the surfaces contacting the partial electrodes 30a-30c).

Figure 8A:
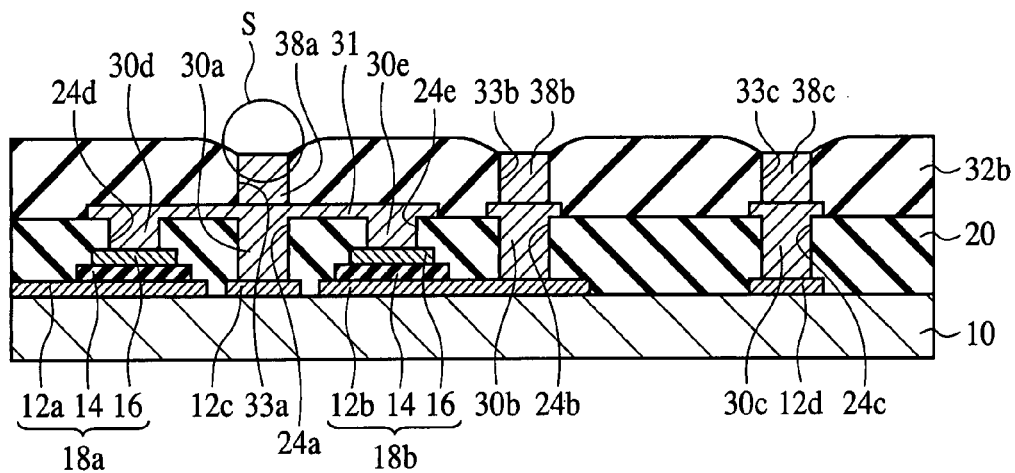
FIGS. 8A to 8C are views illustrating the steps of the method for manufacturing the interposer and the electronic device according to the embodiment of the present invention (Part 6).
Figure 8B:
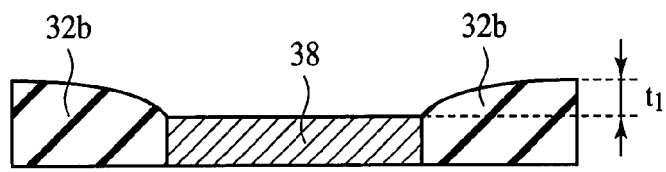

As illustrated in FIG. 8A and FIG. 8B, immediately after the rough cut, the difference $t_1$ between the height of one surface of the resin layer 32b (opposite to the surface contacting the resin layer 20) and the height of one surfaces of the partial electrodes 38a-38c (opposite to the surface contacting the partial electrodes 30a-30c) is about hundreds nm which is relatively large. FIG. 8B is an enlarged sectional view of the part in the circle S in FIG. 8A.

When the difference $t_1$ between the height of one surface of the resin layer 32b (opposite to the surface contacting the resin layer 20) and the height of one surface of the partial electrodes 38a-38c (opposite to the surfaces contacting the partial electrodes 30a-30c) is such relatively large, even when the resin layer 42b is cured and shrunk by the thermal processing in the later step, one surface of the resin layer 32b (opposite to the surface contacting the resin layer 20) remains higher than one surfaces of the partial electrodes 38a-38c (opposite to the surfaces contacting the partial electrodes 30a-30c), and often the partial electrodes 38a-38c cannot be connected to the partial electrodes 56a-56c.

Figure 8C:
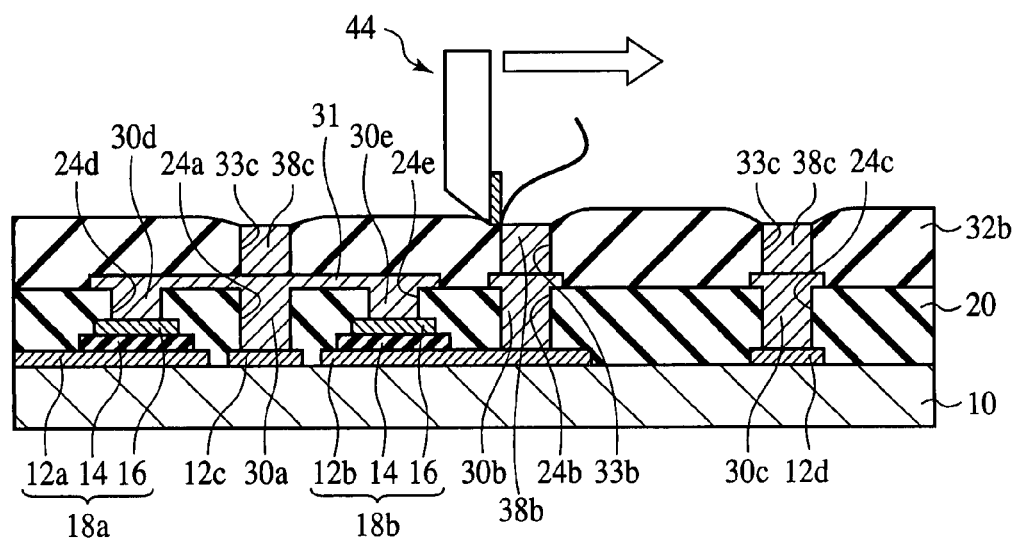

To prevent such case, the rough cut is followed by finish cut so that the difference $t_1$ between the height of one surface of the resin layer 32b (opposite to the surface contacting the resin layer 20) and the height of one surfaces of the partial electrodes 38a-38c (opposite to the surfaces contacting the partial electrodes 30a-30c) can be a suitable value (see FIG. 8C).

The conditions for finish cutting the upper parts of the partial electrodes 38a-38c and the upper part of the resin layer 32b are as exemplified below.

The rank of the cutting tool 44 and the rotation number of the chuck table 42 for the finish cut are the same as the conditions for rough cutting the resin layer 32b. The feed of the cutting tool 44 for the finish cut is, e.g., 20 μm/rotation.

The cut amount of the cutting tool 44 is, e.g., 500 nm. The cut amount of the cutting tool is set so small, so that the difference $t_1$ between the height of one surface of the resin layer 32b (opposite to the surface contacting the resin layer 20) and the height of one surfaces of the partial electrodes 38a-38c (opposite to the surfaces contacting the partial electrodes 30a-30c) can be suitably small.

The cut amount of the cutting tool 44 is not essentially 500 nm. The cut amount of the cutting tool 44 may be set at, e.g., about 10-100 nm.

The difference $t_1'$ between the height of one surface of the resin layer 32b (opposite to the surface contacting the resin layer 20) and the height of one surfaces of the partial electrodes 38a-38c (opposite to the surfaces contacting the partial electrodes 30a-30c) cannot be made zero even by the finish cut. This is because the resin layer 32b is somewhat compression deformed also in the finish cut, and after the finish cut, the resin layer 32b which has been compression deformed by the finish cut is somewhat recovered. FIG. 9B is an enlarged sectional view of the part in the circle S in FIG. 9A.

In the finish cut, it is preferable to make the finish cut so that the difference $t_1'$ between one surface of the resin layer 32b (opposite to the surface contacting the resin layer 20) and the height of one surfaces of the partial electrodes 38a-38c (opposite to the surfaces contacting the partial electrodes 30a-30c) can be about 0-100 nm.

For the following reason, the difference $t_1'$ between one surface of the resin layer 32b (opposite to the surface contacting the resin layer 20) and the height of one surfaces of the partial electrodes 38a-38c (opposite to the surfaces contacting the partial electrodes 30a-30c) is made about 0-100 nm.

That is, when the difference $t_1'$ between the height of one surface of the resin layer 32b (opposite to the surface contacting the resin layer 20) and the height of one surfaces of the partial electrodes 38a-38c (opposite to the surfaces contacting the partial electrodes 30a-30c) is above 100 nm, as described above, even when the resin layer 32b is cured and shrunk by the thermal processing in the later step, one surface of the resin layer 32b (opposite to the surface contacting the resin layer 20) remains higher than one surfaces of the partial electrodes 38a-38c (opposite to the surfaces contacting the partial electrodes 30a-30c), and often the partial electrodes 38a-38c cannot be connected to the partial electrodes 56a-56c.

On the other hand, when one surface of the resin layer 32b (opposite to the surface contacting the resin layer 20) is lower than one surfaces of the partial electrodes 38a-38c (opposite to the surfaces contacting the partial electrodes 30a-30c), the resin layer 32b and the resin layer 48b shrink without being surely adhered to each other by the thermal processing in the later step, and it is difficult to adhere the resin layer 32b and the resin layer 48b to each other.

For this reason, it is preferable that the difference $t_1'$ between the height of one surface of the resin layer 32b (opposite to the surface contacting the resin layer 20) and the height of surfaces of the partial electrodes 38a-38c (opposite to the surfaces contacting the partial electrodes 30a-30c) is 0-100 nm.

When a burr is formed on the partial electrodes 38a-38c in the cut, there is a risk that the burr may short-circuit the adjacent or neighboring partial electrodes 38a-38c. Accordingly, it is preferable to set the cut conditions so that no burr is formed in the partial electrodes 38a-38c by the cut.

Figure 9A:
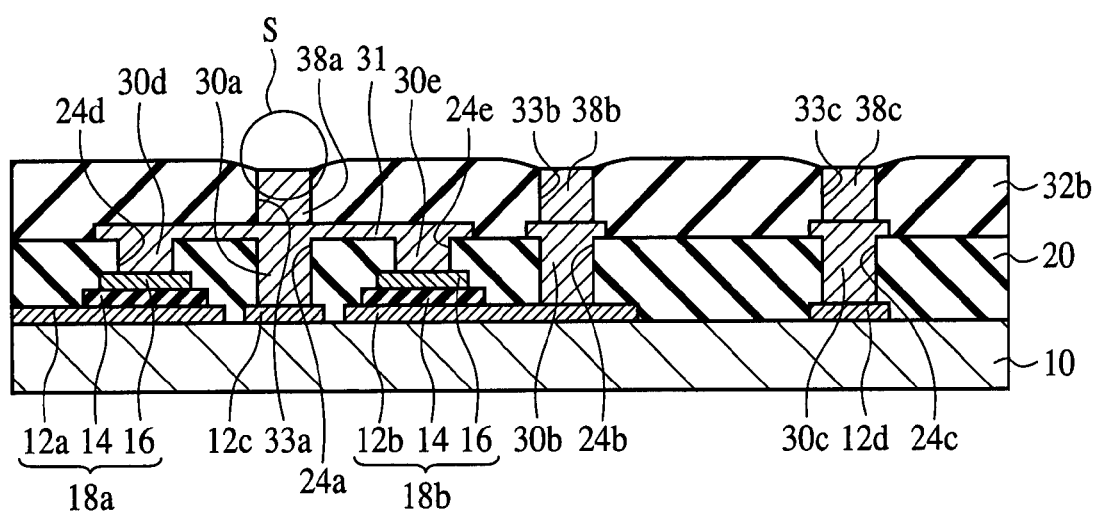
FIGS. 9A and 9B are views illustrating the steps of the method for manufacturing the interposer and the electronic device according to the embodiment of the present invention (Part 7).
Figure 9B:
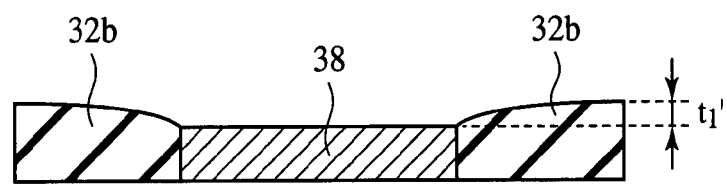

Thus, the upper parts of the partial electrodes 38a-38c and the upper part of the resin layer 32b are cut (see FIGS. 9A and 9B).

It is also possible to make the cut by fixing the semiconductor substrate 10 while the wheel (not illustrated) with the cutting tool 44 mounted is turned (not illustrated).

Figure 10A:
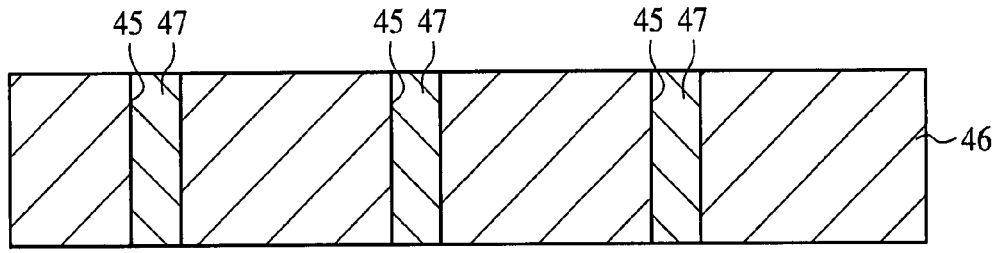
FIGS. 10A to 10D are views illustrating the steps of the method for manufacturing the interposer and the electronic device according to the embodiment of the present invention (Part 8).

On the other hand, as illustrated in FIG. 10A, the glass substrate 46 is prepared. The plural through-holes 45 are formed in the glass substrate 46, and the through-electrodes 47 are buried respectively in the through-holes 45. The diameter of the through-holes 45 is, e.g., about 100-400 nm. The through-holes 45 are formed, e.g., with a drill. The through-holes 45 may be formed by sand blast, supersonic processing or others. The pitch of the through-holes 45, i.e., the pitch of the through-electrodes 47 is, e.g., about 300 μm. The thickness of the glass substrate 46 is, e.g., about 200-600 μm. The thickness of the glass substrate 46 is 400 μm here. The glass substrate 46 is preferably borosilicate glass, which is a glass material with boron oxide added. The glass substrate 46 is preferably borosilicate glass, because the thermal expansion coefficient of borosilicate glass is approximate to that of silicon. The glass substrate 46 is borosilicate glass, and the semiconductor substrate 10 is silicon, whereby when the glass substrate 46 and the semiconductor substrate 10 are adhered to each other in a later step, the possibility of their release can be made low. Such borosilicate glass is a very good glass material whose heat resistance is high and can endure abrupt heating and abrupt cooling. Such borosilicate glass is exemplified by PYREX (registered trademark) glass. As the material of the through-electrodes 47, iron-nickel-cobalt alloy, for example, is used. As such glass substrate 46, the glass substrate manufactured by, e.g., TECNISCO LIMITED can be used.

Figure 10B:
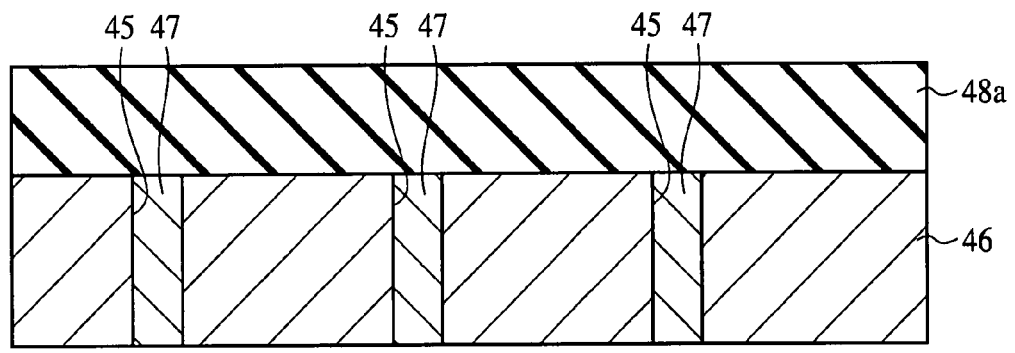

Then, as illustrated in FIG. 10B, the resin layer 48a is formed on the entire surface by, e.g., spin coating. The resin layer 48a can be formed of, e.g., BCB resin (benzocyclobutene) resin. As the material of such BCB resin, BCB precursor solution by Dow Chemical Company (trade name: CYCLOTENE 4024-40) or others. As described above, such BCB resin is a thermosetting resin having the curing property that the BCB resin is liquid before being subjected to thermal processing, is semi-cured by further thermal processing and is completely cured by further thermal processing. The conditions for the thermal processing for semi-curing such BCB resin are 180° C. and about 1 hour, the conditions for the thermal processing for completely curing the BCB resin are 250° C. and about 1 hour. The film thickness of the resin layer 48a is, e.g., about 5 μm. The resin layer 48a immediately after spin coating, which has not been yet subjected to the thermal processing, is liquid.

Figure 10C:
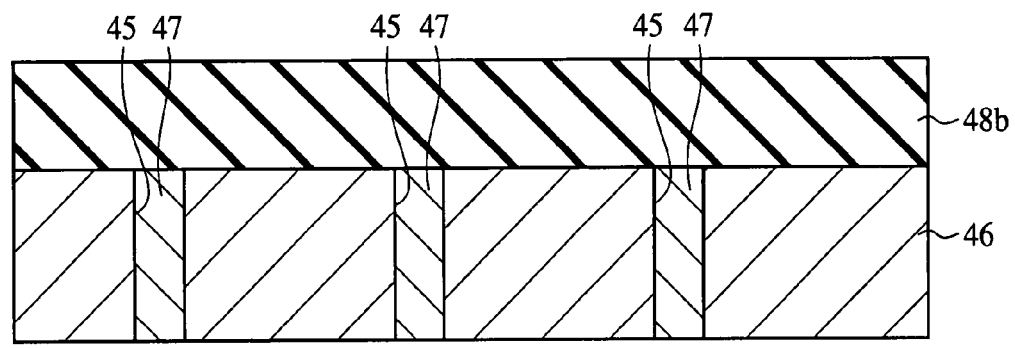

Next, the thermal processing is made under the conditions for semi-curing the resin layer 48a to thereby change the non-cured resin layer 48a into the semi-cured resin layer 48b (see FIG. 10C). The cure percentage of the resin layer 48b is preferably 40-80%. The cure percentage of the resin layer 48b is 50-60% here. The thermal processing temperature is, e.g., about 150° C., and the thermal processing period of time is, e.g., about 1 hour. As described above, the thermal processing temperature is set preferably higher than the boiling point of the solvent of the BCB resin solution.

Figure 10D:
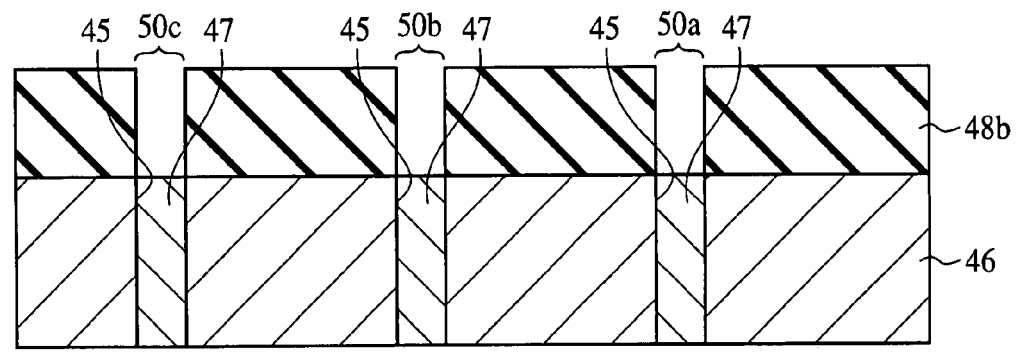

Then, by photolithography, the openings 50a-50c are formed in the resin layer 48b down to the through-electrodes 47 buried in the glass substrate 46 (see FIG. 10D). The opening 50a is for burying the partial electrode 56a and is formed corresponding to the partial electrode 38c. The opening 50b is for burying the partial electrode 56b and is formed corresponding to the partial electrode 38b. The opening 50c is for burying the partial electrode 56c and is formed corresponding to the partial electrode 38c.

Next, a seed layer (not illustrated) of Cr film and Cu film sequentially laid is formed on the entire surface by, e.g., sputtering.

Next, a photo-resist film 52 is formed on the entire surface by spin coating.

Figure 11A:
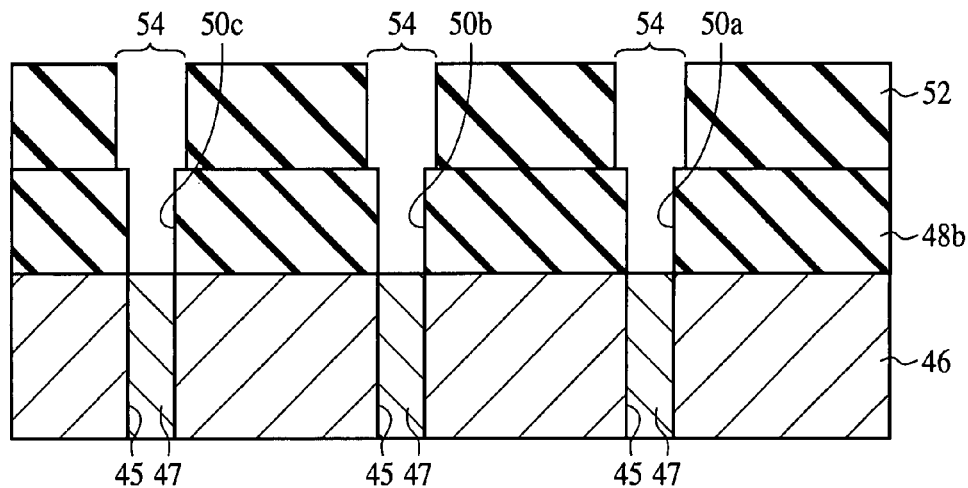
FIGS. 11A to 11C are views illustrating the steps of the method for manufacturing the interposer and the electronic device according to the embodiment of the present invention (Part 9).
Figure 11B:
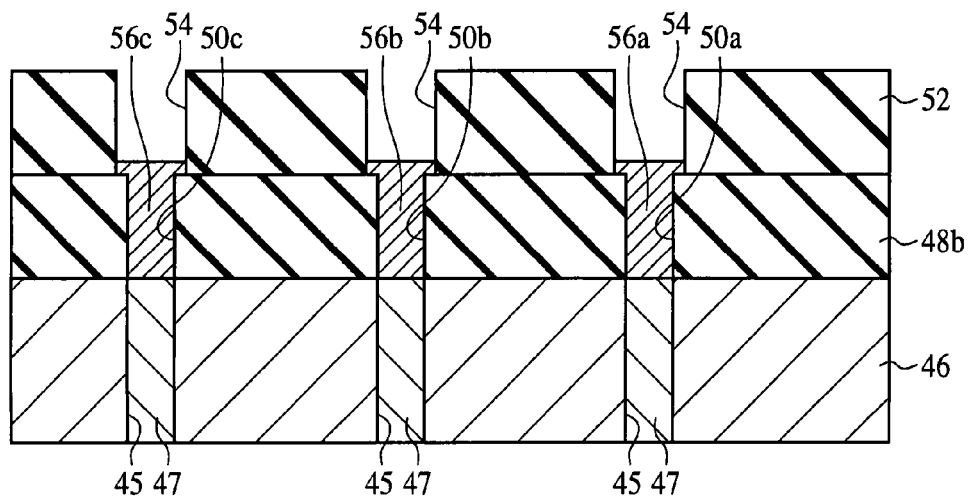

Next, the openings 54 are formed in the photo-resist film 52 by photolithography (see FIG. 11A). The openings 54 are for forming the partial electrodes 56a-56c.

Next, a plated film of, e.g., Cu is formed in the openings 50a-50c and in the openings 54 by electroplating. The thickness of the plated film is, e.g., about 6 μm. Thus, the partial electrodes 56a-56c of the plated film are formed in the openings 50a-50c and in the openings 54. The partial electrodes 56a-56c are formed corresponding to the partial electrodes 38a-38c formed on the semiconductor substrate 10 (see FIG. 11B).

Figure 11C:
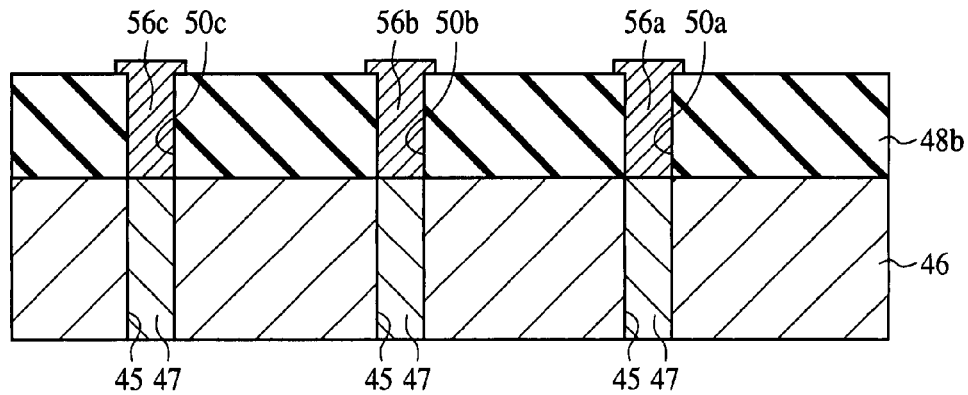

Next, the photo-resist film 52 is released (see FIG. 11C).

Then, the exposed seed layer (not illustrated) is removed by wet etching. The etchant is, e.g., about 1-10% ammonium persulfate aqueous solution. The etching period of time is, e.g., about 2 minutes. When the seed layer is etched off, the surfaces of the partial electrodes 56a-56c are also etched a little. However, the seed layer whose thickness is sufficiently smaller than the size of the partial electrodes 56a-56c can be etched in a short period of time, and the partial electrodes 56a-56c are never excessively etched.

Then, as illustrated in FIG. 12A, the glass substrate 46 is fixed onto the chuck table 42 of the ultraprecision lathe 40 by vacuum suction. FIG. 12A is a perspective view of the glass substrate fixed to the ultraprecision lathe.

The glass substrate 46 is fixed to the chuck table with the underside of the glass substrate 46, i.e., the surface where the partial electrodes 56a-56c, etc. are not formed secured to the chuck table 42. To fix the glass substrate 46 to the chuck table 42, it is preferable to use a pin chuck (not illustrated).

Then, as illustrated in FIG. 12A, with the glass substrate 46 set on rotation, the upper parts of the partial electrodes 56a-56c and the upper part of the resin layer 48b are cut with the cutting tool 44 of diamond (see FIG. 12B). At this time, rough cut is made until the thickness of the resin layer 48b is reduced to about 4 μm.

The conditions for rough cutting the upper parts of the partial electrodes 56a-56c and the upper part of the resin layer 48b are as exemplified below.

The rake angle of the cutting tool 44 is, e.g., 0 degree.

The rotation number of the chuck table 42 is, e.g., about 3000 rpm. In this case, the cut speed is, e.g., about 30 m/second.

The cut amount of the cutting tool 44 is, e.g., 2-3 μm.

The feed of the cutting tool 44 is, e.g., 50 μm/rotation.

The thickness of the resin layer 48b before cut is, e.g., about 6 μm, while the cut amount of the cutting tool 44 is, e.g., about 2-3 μm. When the cut is made until the thickness of the resin layer 48b becomes the level of about 4 μm, the thickness of the part of the resin layer 48b to be cut is larger than the cut amount of the cutting tool 44. Accordingly, the upper part of the resin layer 48b is cut plural times to thereby make the thickness of the resin layer 48b about 3 μm.

When the upper parts of the partial electrodes 56a-56c and the upper part of the resin layer 48b are cut with the cutting tool 44, somewhat large force is applied to the partial electrodes 56a-56c and the resin layer 48b by cutting tool 44. When the upper part of the resin layer 48b is cut, the force is applied not only horizontally to one surface of the resin layer 48b (opposite to the surface contacting the glass substrate 46) but also perpendicularly to one surface of the resin layer 48b (opposite to the surface contacting the glass substrate 46). Accordingly, while the resin layer 48b is being somewhat compression deformed, the resin layer 48b is cut. The resin layer 48b which has been compression deformed by the cutting tool 44 is somewhat recovered after cut. On the other hand, the partial electrodes 56a-56c, which are formed of metal, such as Cu or others, are not substantially deformed during the cut. Accordingly, one surface of the resin layer 48b after cut (opposite to the surface contacting the glass substrate 46) is higher than one surfaces of the partial electrodes 56a-56c after cut (opposite to the surfaces contacting the glass substrate 46).

Figure 13A:
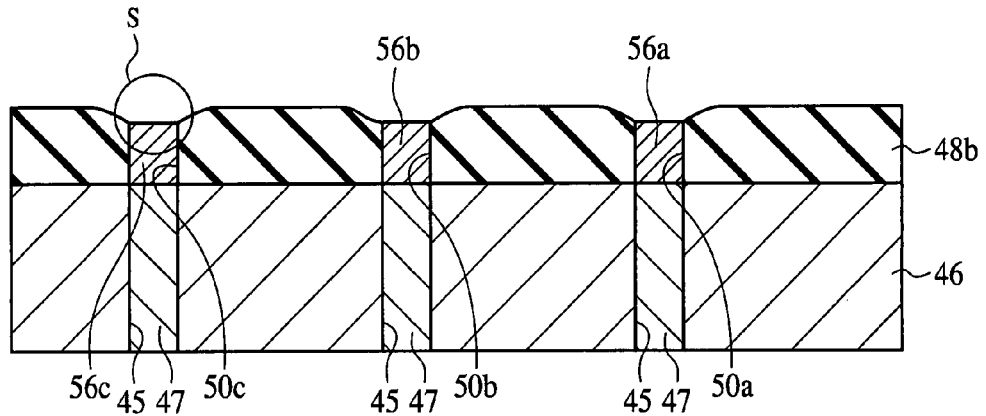
FIGS. 13A to 13C are views illustrating the steps of the method for manufacturing the interposer and the electronic device according to the embodiment of the present invention (Part 11).
Figure 13B:
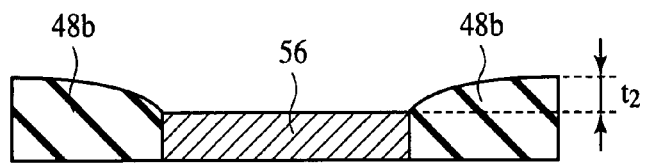

Immediately after the rough cut, as illustrated in FIGS. 13A and 13B, the difference $t_2$ between the height of one surface of the resin layer 48b (opposite to the surface contacting the glass substrate 46) and the height of one surfaces of the partial electrodes 56a-56c (opposite to the surfaces contacting the glass substrate 46) is about hundreds nm which is relatively large. FIG. 13B is an enlarged sectional view of the part in the circle S in FIG. 13A.

When the difference $t_2$ between the height of one surface of the resin layer 48b (opposite to the surface contacting the glass substrate 46) and the height of one surfaces of the partial electrodes 56a-56c (opposite to the surfaces contacting the glass substrate 46) is such relatively large, one surface of the resin layer 48b (opposite to the surface contacting the glass substrate 46) remains higher than one surfaces of the partial electrodes 56a-56c (opposite to the surfaces contacting the glass substrate 46) even when the resin layer 48b is cured and shrunk by thermal processing in a later step, and often the partial electrodes 38a-38c and the partial electrodes 56a-56c cannot be connected to each other.

Figure 13C:
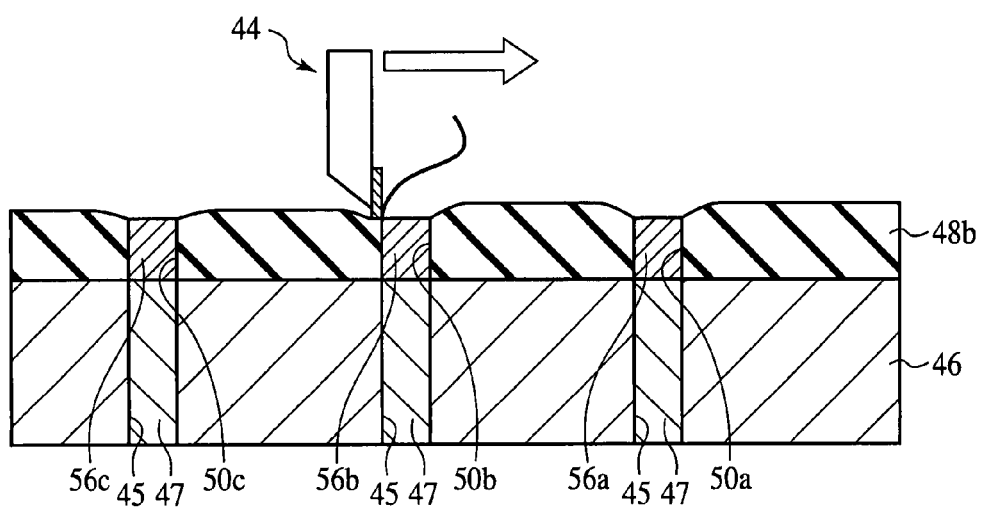

To avoid this, the rough cut is followed by finish cut so that the difference $t_2$ between the height of one surface of the resin layer 48b (opposite to the surface contacting the glass substrate 46) and the height of one surfaces of the partial electrodes 56a-56c (opposite to the surfaces contacting the glass substrate 46) (see FIG. 13C).

The conditions for cutting the upper part of the partial electrodes 56a-56c and the upper part of the resin layer 48b are as exemplified below.

The rake angle of the cutting tool 44, the rotation number of the chuck table 42 and the feed of the cutting tool 44 for the finish cut are the same as those for rough cutting the resin layer 48b. It is not necessary to change the sets for the finish cut, which follows the rough cut.

The cut amount of the cutting tool 44 is, e.g., 500 nm. The cut amount of the cutting tool 44 is set so small so that the difference $t_2$ between the height of one surface of the resin layer 48b (opposite to the surface contacting the glass substrate 46) and the height of one surfaces of the partial electrodes 56a-56c (opposite to the surfaces contacting the glass substrate 46) can be suitably small.

The cut amount of the cutting tool 44 is not essentially 500 nm. The cut amount of the cutting tool 44 may be set at, e.g., about 10-100 nm.

Even the finish cut does not make zero the difference $t_2'$ between the height of one surface of the resin layer 48b (opposite to the surface contacting the glass substrate 46) and the height of one surfaces of the partial electrodes 56a-56c (opposite to the surfaces contacting the glass substrate 46). This is because the resin layer 48b is somewhat compression deformed by the finish cut, and the resin layer 48b which has been deformed by the finish cut somewhat recovers after the cut. FIG. 14B is a sectional view of the part in the circle S in FIG. 14A.

In the finish cut, it is preferable that the finish cut is made so that the difference $t_2'$ between the height of one surface of the resin layer 48b (opposite to the surface contacting the glass substrate 46) and the height of one surfaces of the partial electrodes 56a-56c (opposite to the surfaces contacting ht glass substrate 46) becomes about 0-100 nm.

For the following reason, the difference $t_2'$ between the height of one surface of the resin layer 48b (opposite to the surface contacting the glass substrate 46) and the height of one surfaces of the partial electrodes 56a-56c (opposite to the surfaces contacting the glass substrate 46) is 0-100 nm.

That is, when the difference $t_2'$ between the height of one surface of the resin layer 48b (opposite to the surface contacting the glass substrate 46) and the height of one surfaces of the partial electrodes 56a-56c (opposite to the surfaces contacting the glass substrate 46) is above 100 nm, as described above, even when the resin layer 48b is cured and shrunk by thermal processing in a later step, one surface of the resin layer 48b (opposite to the surface contacting the glass substrate 46) is higher than one surfaces of the partial electrodes 56a-56c (opposite to the surfaces contacting the glass substrate 46), and the partial electrodes 38a-38c and the partial electrodes 56a-56c often cannot be connected to each other.

On the other hand, when one surface of the resin layer 48b (opposite to the surface contacting the glass substrate 48) is lower than one surfaces of the partial electrodes 56a-56c (opposite to the surfaces contacting the glass substrate 46), in the thermal processing in the later step, the resin layer 32b and the resin layer 48b are shrunk before the resin layer 32b and the resin layer 48b are adhered to each other, and it is difficult to adhere the resin layer 32b and the resin layer 48b to each other.

For this reason, it is important that the difference $t_2'$ between the height of one surface of the resin layer 48b (opposite to the surface contacting the glass substrate 46) and the height of one surfaces of the partial electrodes 56a-56c (opposite to the surfaces contacting the glass substrate 46) is 0-100 nm.

When the burr is formed on the partial electrodes 56a-56c in the cut, there is a risk that the burr may short-circuit the adjacent or neighboring partial electrodes 56a-56c. (Accordingly, it is preferable to set the cut conditions so that no burr is formed in the partial electrodes 56a-56c by the cut.

Figure 14A:
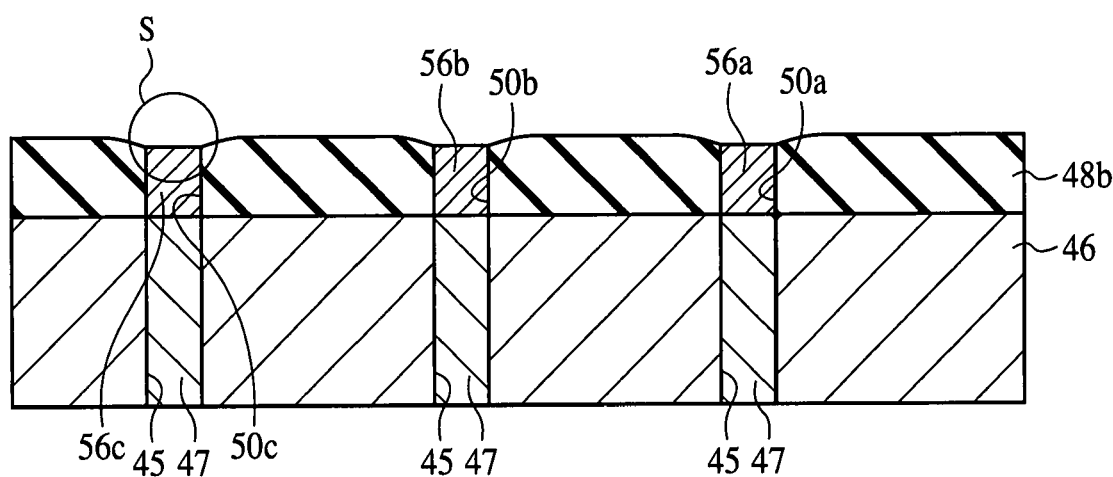
FIGS. 14A and 14B are views illustrating the steps of the method for manufacturing the interposer and the electronic device according to the embodiment of the present invention (Part 12).
Figure 14B:
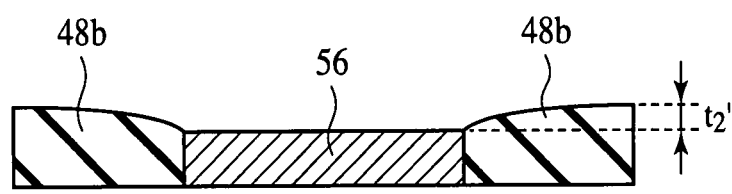

Thus, the upper parts of the partial electrodes 56a-56c and the upper part of the resin layer 48b are cut (see FIGS. 14A and 14B)

The cut processing may be made by turning a wheel (not illustrated) with the cutting tool 44 mounted on while the glass substrate 46 is being fixed.

Then, the semiconductor substrate 10 is cut in a prescribed size with a thin blade formed of diamonds particles, etc. bonded with a binding material (not illustrated).

In the same way, the glass substrate 46 is cut in the prescribed size with the thin blade (not illustrated).

Figure 15A:
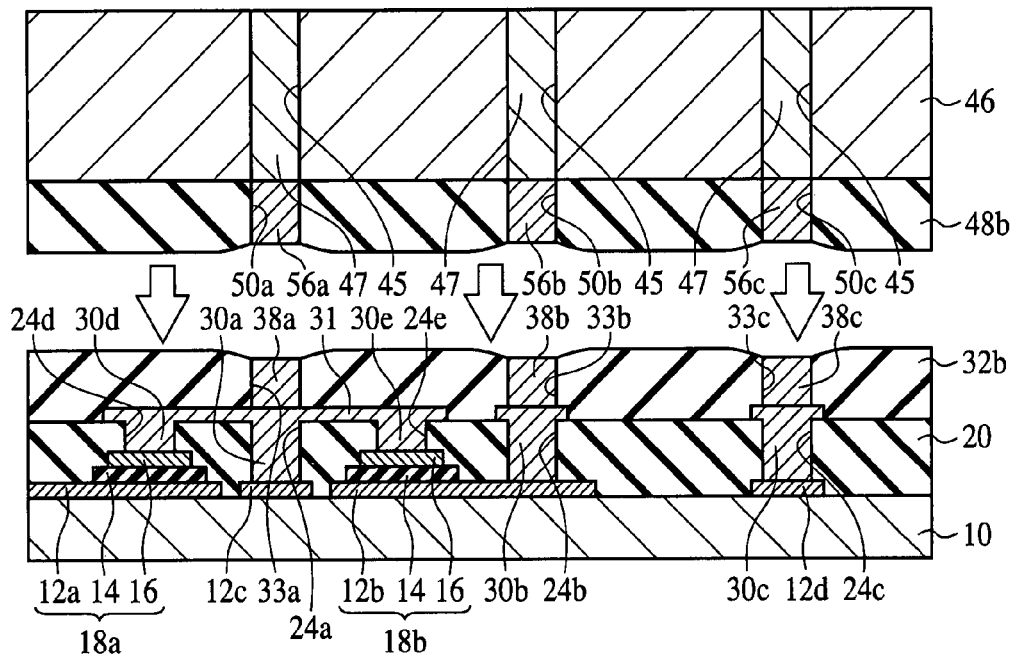
FIGS. 15A to 15C are views illustrating the steps of the method for manufacturing the interposer and the electronic device according to the embodiment of the present invention (Part 13).

Then, as illustrated in FIG. 15A, the semiconductor substrate 10 and the glass substrate 46 are opposed to each other. At this time, with the partial electrodes 38a-38c of the semiconductor substrate 10 and the partial electrodes 56a-56c of the glass substrate 46 brought near each other, the semiconductor substrate 10 and the glass substrate 46 are opposed to each other.

Figure 15B:
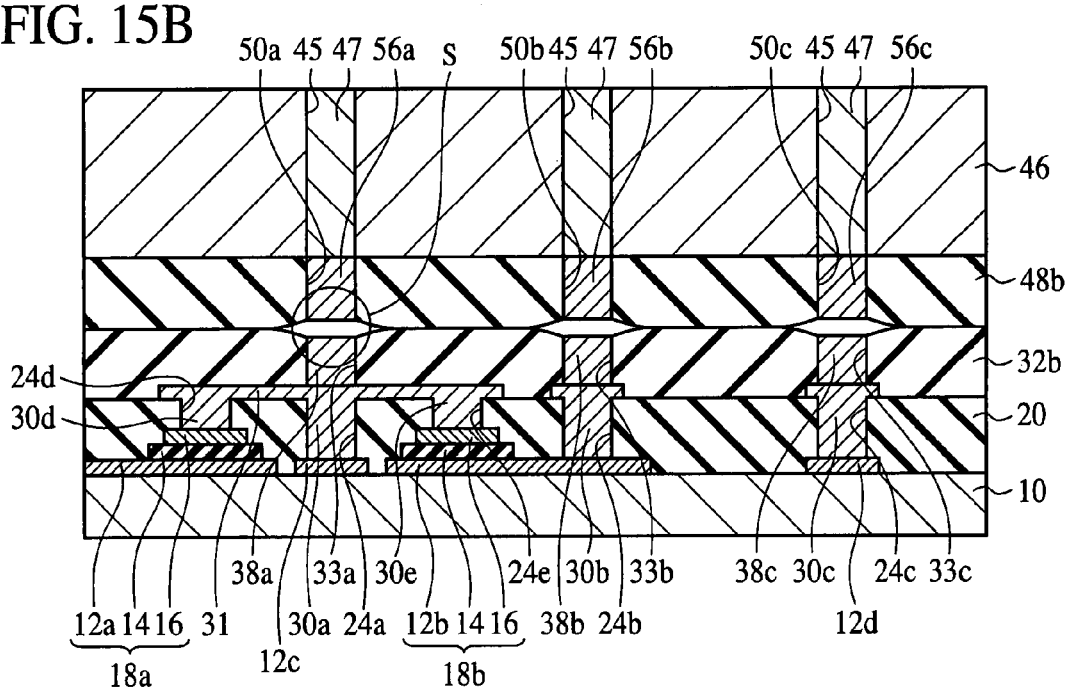
Figure 15C:
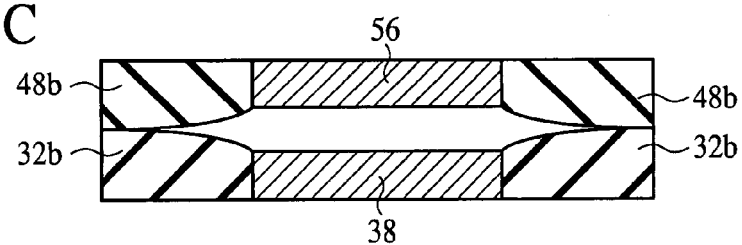

Next, the semiconductor substrate 10 and the glass substrate 46 are brought near each other. FIG. 15B is a sectional view illustrating the resin layer 32b of the semiconductor substrate 10 and the resin layer 48b of the glass substrate 46 contacting each other. FIG. 15C is an enlarged sectional view of the part in the circle S in FIG. 16A.

Figure 16A:
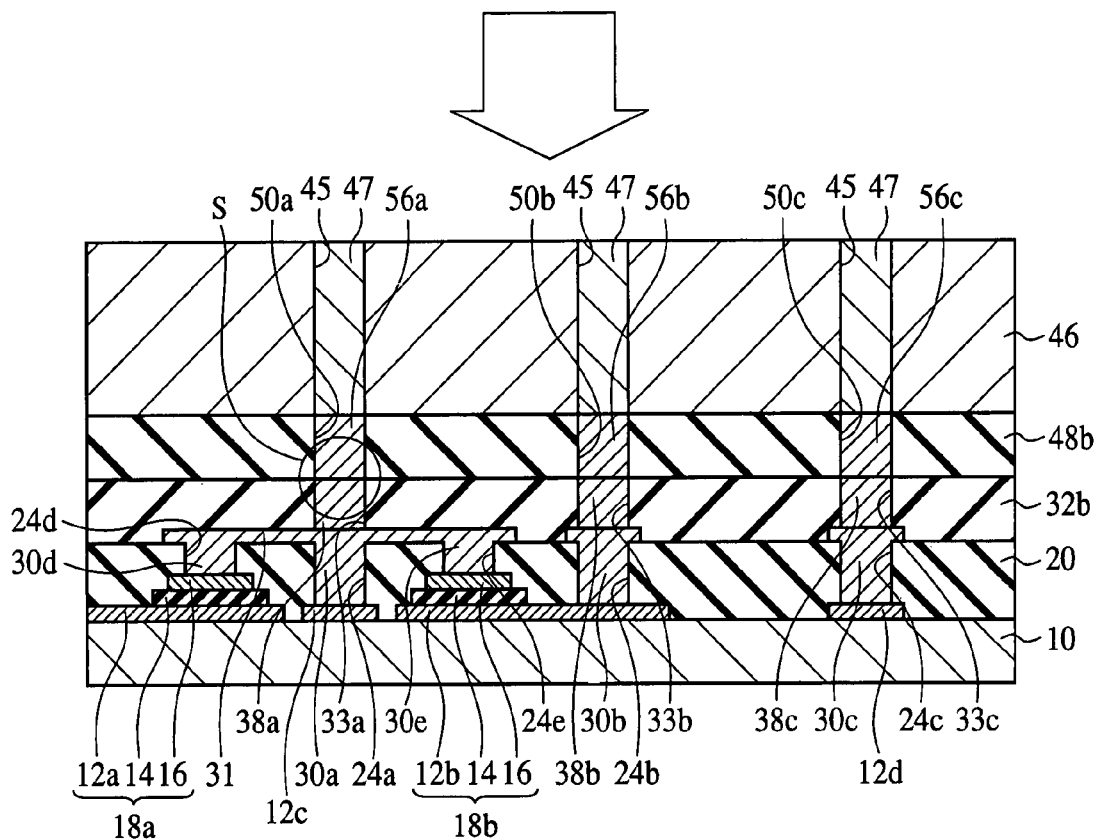
FIGS. 16A and 16B are views illustrating the steps of the method for manufacturing the interposer and the electronic device according to the embodiment of the present invention (Part 14).
Figure 16B:
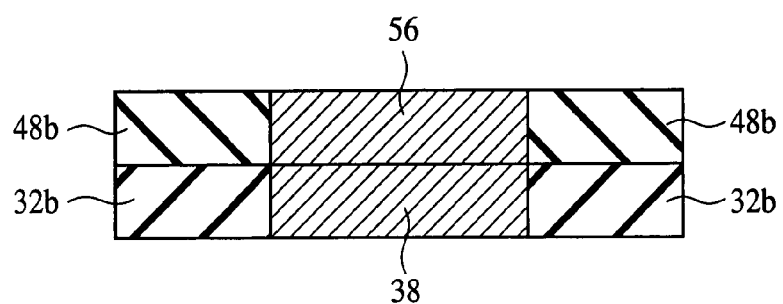

Then a pressure is applied from the outside between the semiconductor substrate 10 and the glass substrate 46 to close contact the partial electrodes 38a-38c of the semiconductor substrate 10 and the partial electrodes 56a-56c of the glass substrate 46, and thermal processing is made with the resin layer 32b of the semiconductor substrate 10 and the resin layer 48b of the glass substrate 46 closely contacted each other (see FIGS. 16A and 16B). FIG. 16B is an enlarged sectional view of the part in the circle S in FIG. 16A.

For the thermal processing, an oven (thermal processing apparatus), for example, is used. The thermal processing temperature is, e.g., 260° C. The thermal processing period of time is, e.g., about 1 hour. The pressure is, e.g., about 10 kPa. Under these condition, the thermal processing made surely adheres the resin layer 32b and the resin layer 48b to each other. The resin layer 32b and the resin layer 48b respectively shrink. The resin layer 32b and the resin layer 48b are adhered to each other while respectively shrinking, and due to the shrink of the resin layer 32b and the resin layer 48b, the partial electrodes 38a-38c and the partial electrodes 56a-56c are connected to each other. The partial electrodes 38a-38c and the partial electrodes 56a-56c are connected to each other due the shrink of the resin layers 32, 48, which makes it unnecessary to apply large pressure between the semiconductor substrate 10 and the glass substrate 46 from the outside.

Figure 17A:
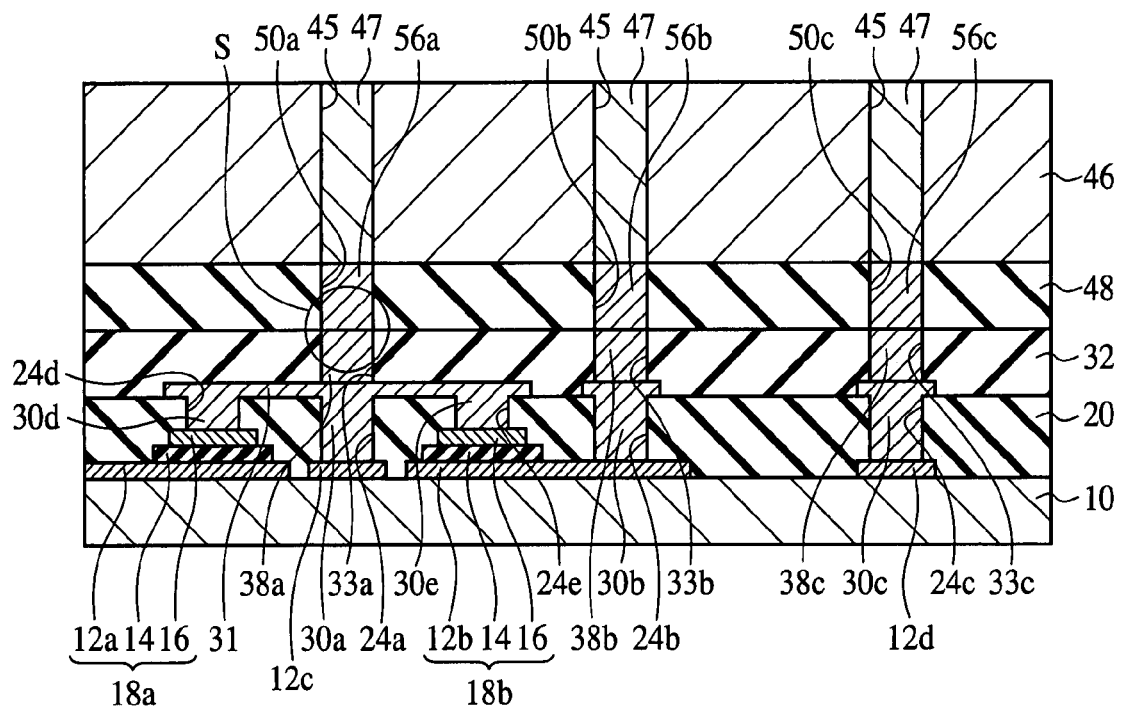
FIGS. 17A and 17B are views illustrating the steps of the method for manufacturing the interposer and the electronic device according to the embodiment of the present invention (Part 15).
Figure 17B:
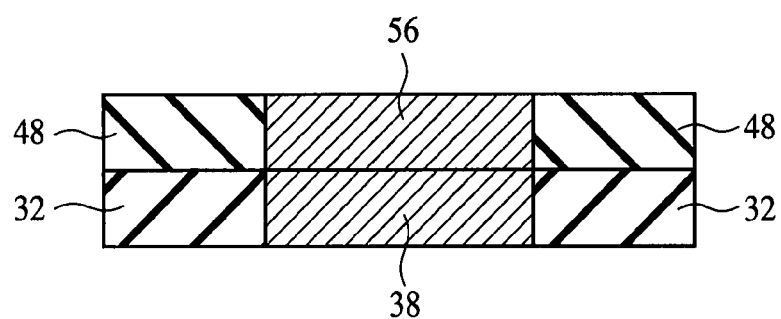

Then, the semi-cured resin layers 32b, 48b become the completely cured resin layers 32, 48 (see FIG. 17A and FIG. 17B). FIG. 17B is an enlarged sectional view of the part in the circle S in FIG. 17A. Because of the completely cured resin layers 32, 48, which have been sufficiently shrunk, the partial electrodes 38a-38c and the partial electrodes 56a-56c never part from each other even when the application of the pressure is stopped.

The thermal processing temperature and the thermal processing period of time are set here at, e.g., 260° C. and 1 hour but are not limited to them. When the thermal processing temperature is set high, the thermal processing period of time may be short. For example, when the thermal processing temperature is set at about 300° C., the thermal processing period of time may be about 3 minutes. When the thermal processing period of time is set short, the thermal processing period of time may be set long. For example, when the thermal processing temperature is set about 200° C., the thermal processing period of time may be set at about 7-8 hours.

However, when the thermal processing temperature is set high, often the film quality of the resin layers 32, 42 do not always become good. When the thermal processing temperature is set low, the thermal processing takes long time. In consideration of the film quality, throughput, etc. of the resin layers 32, 48, it is preferable that the thermal processing temperature is about 250° C., and the thermal processing period of time is about 1 hour.

The pressure to be applied to the semiconductor substrate 10 and the glass substrate 46 is set here at about 10 kPa but is not essentially about 10 kPa. The pressure may be set suitably in the range of, e.g., about 1 kPa-100 kPa.

Next, the semiconductor substrate 10 is polished by, e.g., CMP until the thickness of the semiconductor substrate 10 becomes, e.g., about 100 µm. At this time, the semiconductor substrate 10 is not completely removed so as to prevent the capacitor electrodes 12a, 12b, the conduction films 12c, 12d and the resin layer 20 from being damaged by the polish.

Then, the semiconductor substrate 10 remaining on one surface of the resin layer 20 (opposite to the surface contacting the resin layer 32) is etched off by, e.g., hydrogen fluoride.

Figure 18A:
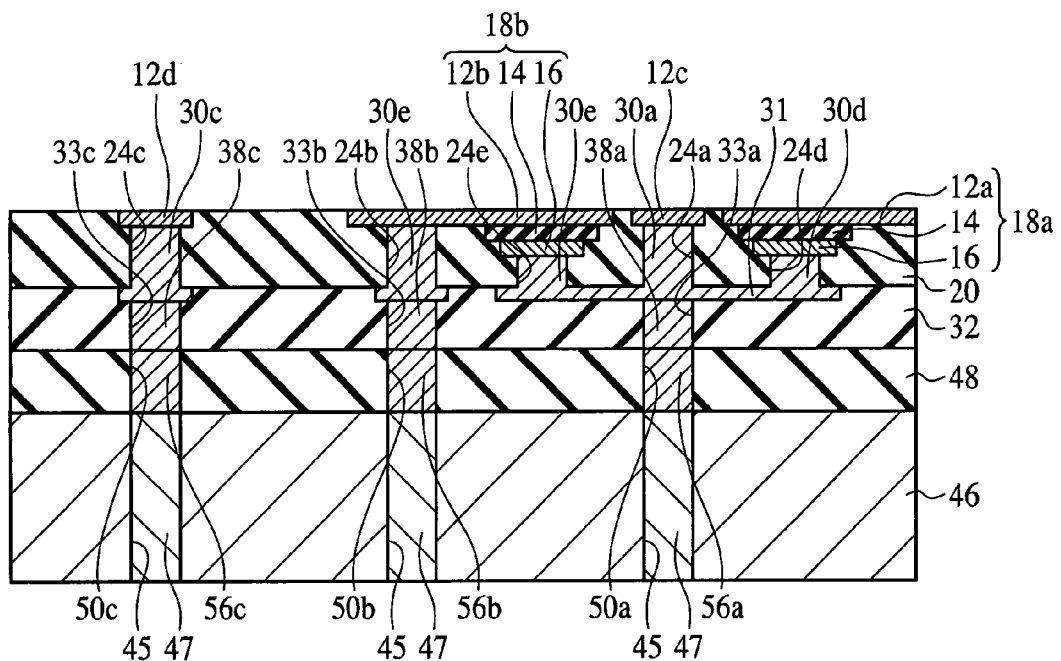
FIGS. 18A and 18B are views illustrating the steps of the method for manufacturing the interposer and the electronic device according to the embodiment of the present invention (Part 16).
Figure 18B:
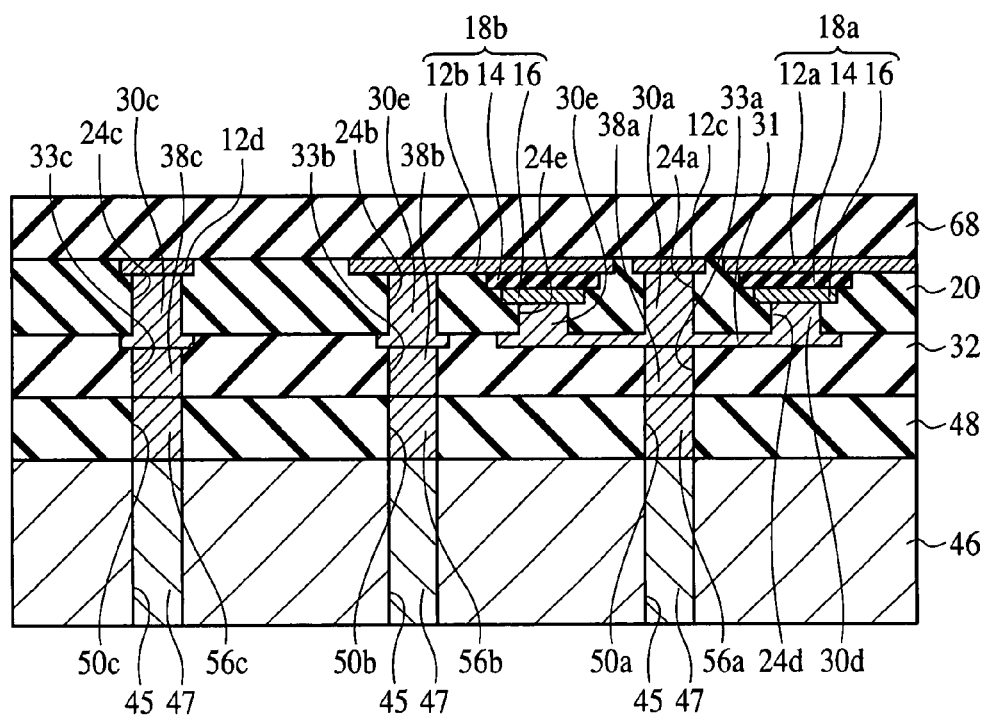

Thus, the semiconductor substrate 10 is removed while the capacitor electrodes 12a, 12b, the conduction films 12c, 12d are being protected from being excessively damaged (see FIG. 18A).

Next, the resin layer 68 is formed on the surface of the resin layer 20 (opposite to the surface contacting the resin layer 32) (see FIG. 18A). The resin layer 68 is formed of, e.g., photosensitive epoxy resin.

Such resin layer 68 can be formed as exemplified below. First, a photosensitive epoxy resin solution is applied to one surface of the resin layer 20 (opposite to the surface contacting the resin layer 32). The conditions for applying the epoxy resin solution are, e.g. 2000 rpm and 30 seconds. Thus, the resin layer 68 of, e.g., a 6 µm-thickness is formed. Then, thermal processing (pre-baking) is made on the resin layer 68. The thermal processing temperature is, e.g., 60° C.

Figure 19A:
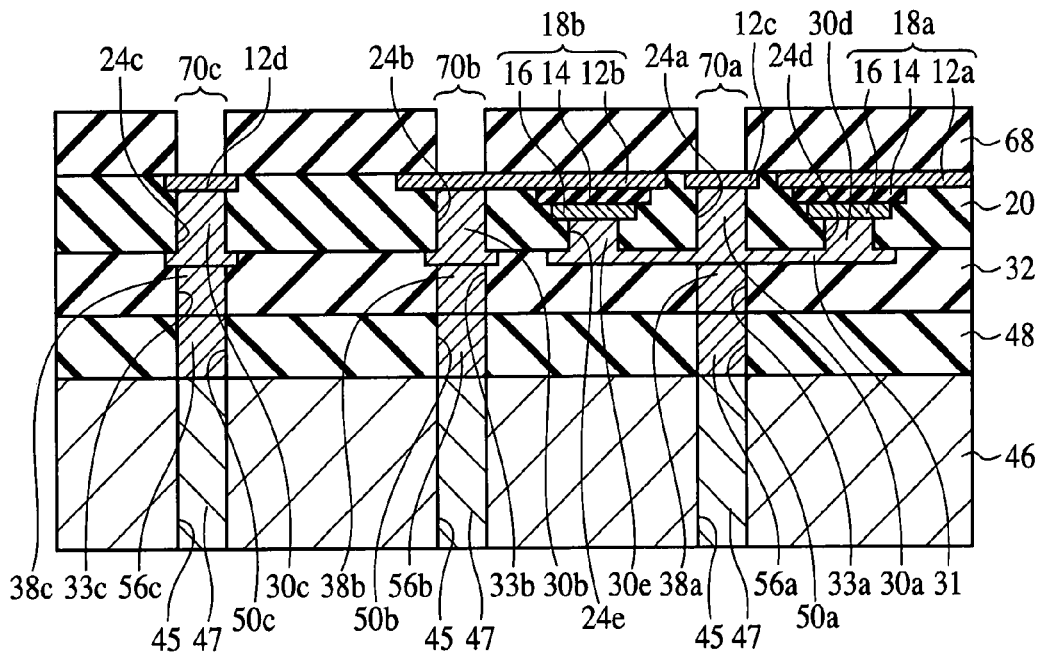
FIGS. 19A and 19B are views illustrating the steps of the method for manufacturing the interposer and the electronic device according to the embodiment of the present invention (Part 17).

Then, the openings 70a-70c are formed in the resin layer 68 by photolithography (see FIG. 19A). The openings 70a is for burying the partial electrode 76a to be a part of the through-electrode 77a, and is formed down to the conduction film 12c. The openings 70b is for burying the partial electrode 76b to be a part of the through-electrode 77b and is formed down to the capacitor electrode 12b. The openings 70c is for burying the partial electrode 76c to be a part of the through-electrode 77c and is formed down to the conduction film 12d.

Next, thermal processing (main baking) is made on the resin layer 68. The thermal processing temperature is, e.g., 200° C. The film thickness of the resin layer 68 which has been subjected to such thermal processing is, e.g., about 3 µm.

Next, a seed layer (not illustrated) of Cr film and Cu film sequentially laid is formed on the entire surface by, e.g., sputtering.

Then, a photoresist film 72 is formed on the entire surface by spin coating.

Figure 19B:
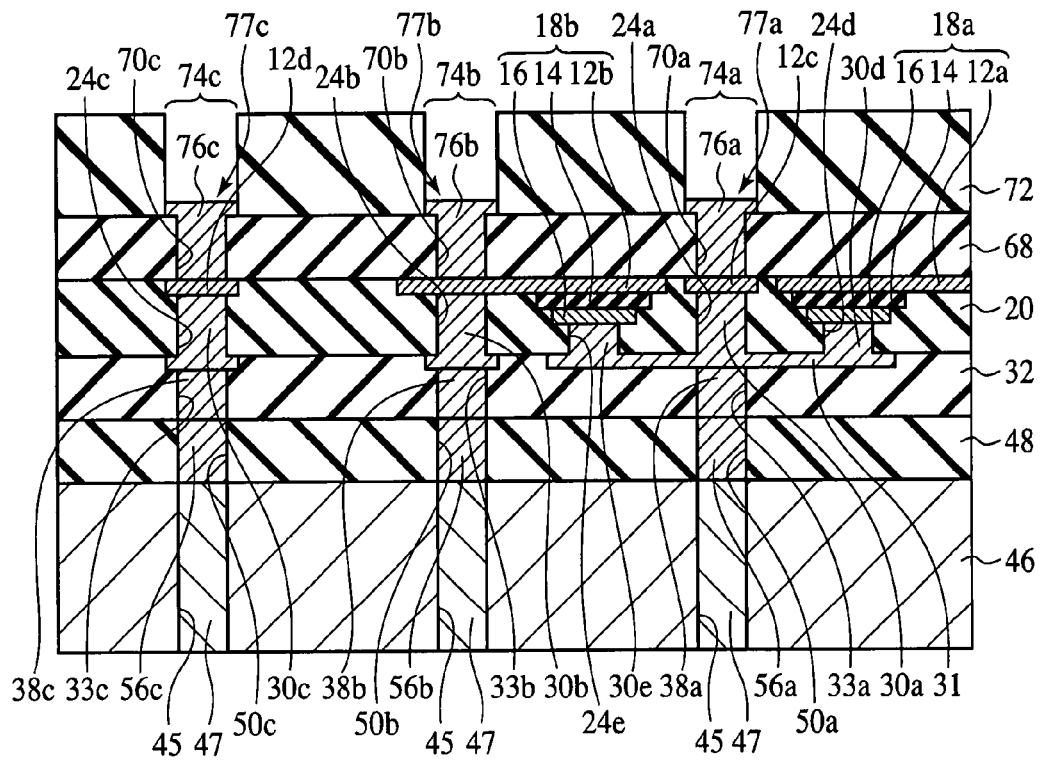

Next, the openings 74a-74c are formed in the photoresist film 72 by photolithography (see FIG. 19B). The openings 74a-74c are respectively for forming the partial electrodes 76a-76c.

Next, a plated film of, e.g., Cu is formed in the openings 74a-74c and the openings 70a-70c by electroplating. The thickness of the plated film is, e.g., about 6 µm. Thus, the partial electrodes 76a-76c are formed of the plated film respectively in the openings 74a-74c and the openings 70a-70c.

Figure 20A:
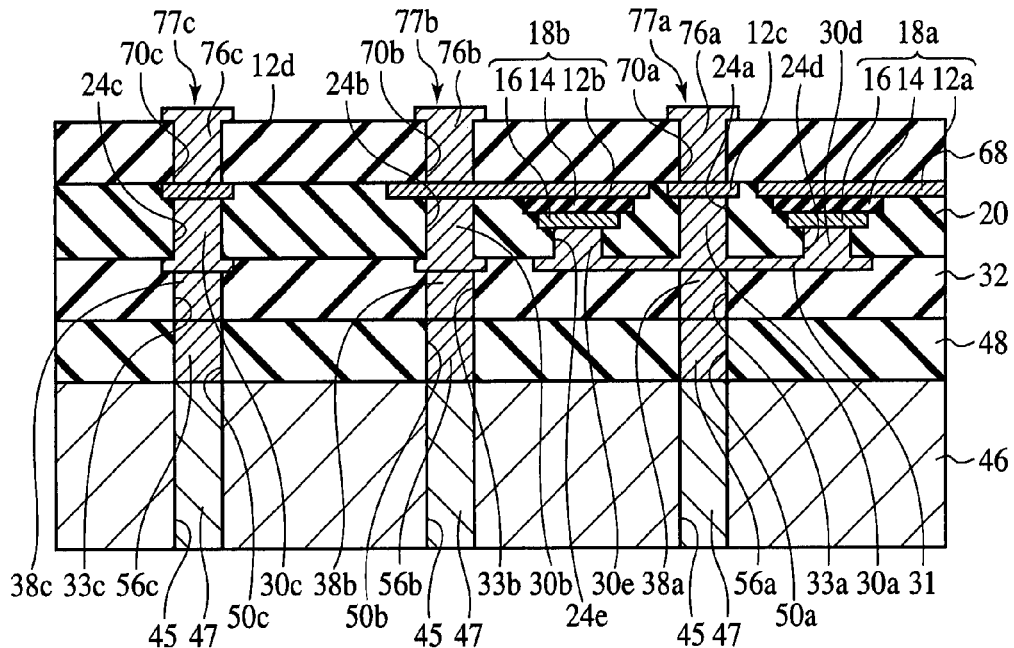
FIGS. 20A and 20B are views illustrating the steps of the method for manufacturing the interposer and the electronic device according to the embodiment of the present invention (Part 18).

Next, the photoresist film 72 is released (see FIG. 20A).

Next, the exposed seed layer (not illustrated) is removed by wet etching. The etchant is, e.g., 1-10% ammonium persulfate aqueous solution. The etching period of time is, e.g., 2 minutes. When the seed layer is etched off, the surfaces of the partial electrodes 76a-76c are a little etched but are never excessively etched, because the thickness of the seed layer is sufficiently smaller in comparison with the size of the partial electrodes 76a-76c.

Then, a seed layer (not illustrated) of Ti film and Cu film sequentially laid is formed entirely on one surface of the glass substrate 46 (opposite to the surface contacting the resin layer 48) by, e.g., sputtering.

Next, a photoresist film 88 is formed on the entire surface by spin coating.

Figure 20B:
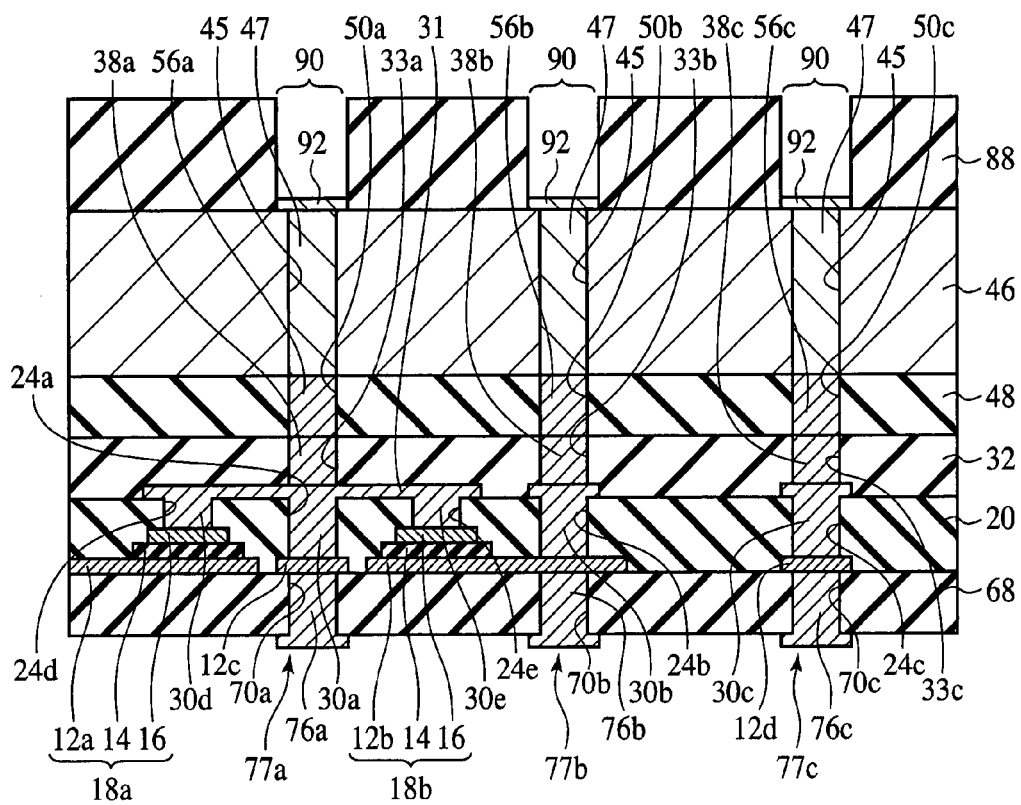

Next, the openings 90 are formed in the photoresist film 88 by photolithography (see FIG. 20B). The openings 90 are for forming the electrode pads 92.

Then, a plated film of, e.g., Ni is formed in the openings 90 by electroplating. The thickness of the plated film is, e.g., about 4 µm. Thus, the electrode pads 92 of the plated film are formed in the openings 90.

Figure 21A:
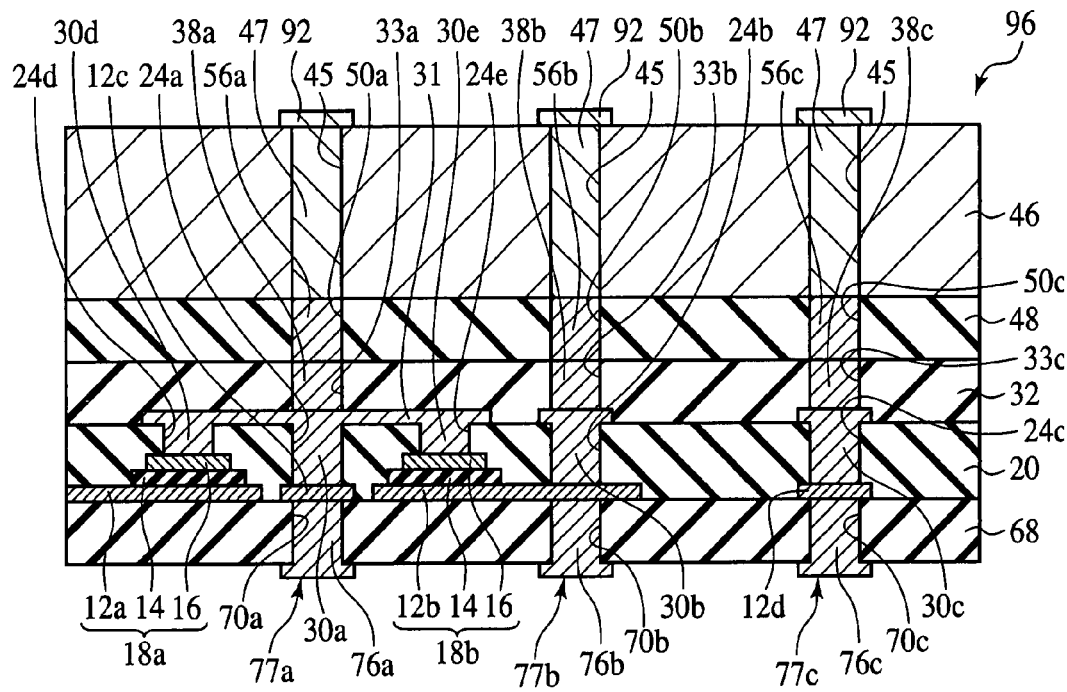
FIGS. 21A and 21B are views illustrating the steps of the method for manufacturing the interposer and the electronic device according to the embodiment of the present invention (Part 19).

Next, the photoresist film 88 is released (see FIG. 21A).

Next, the exposed seed layer (not illustrated) is removed by wet etching. The etchant is, e.g., about 1-10% ammonium persulfate aqueous solution. The etching period of time is, e.g., about 2 minutes. When the seed layer is etched off, the surfaces of the electrode pads 92 are a little etched but are never excessively etched because the thickness of the seed layer is sufficiently small in comparison with the size of the electrode pads 92.

Figure 21B:
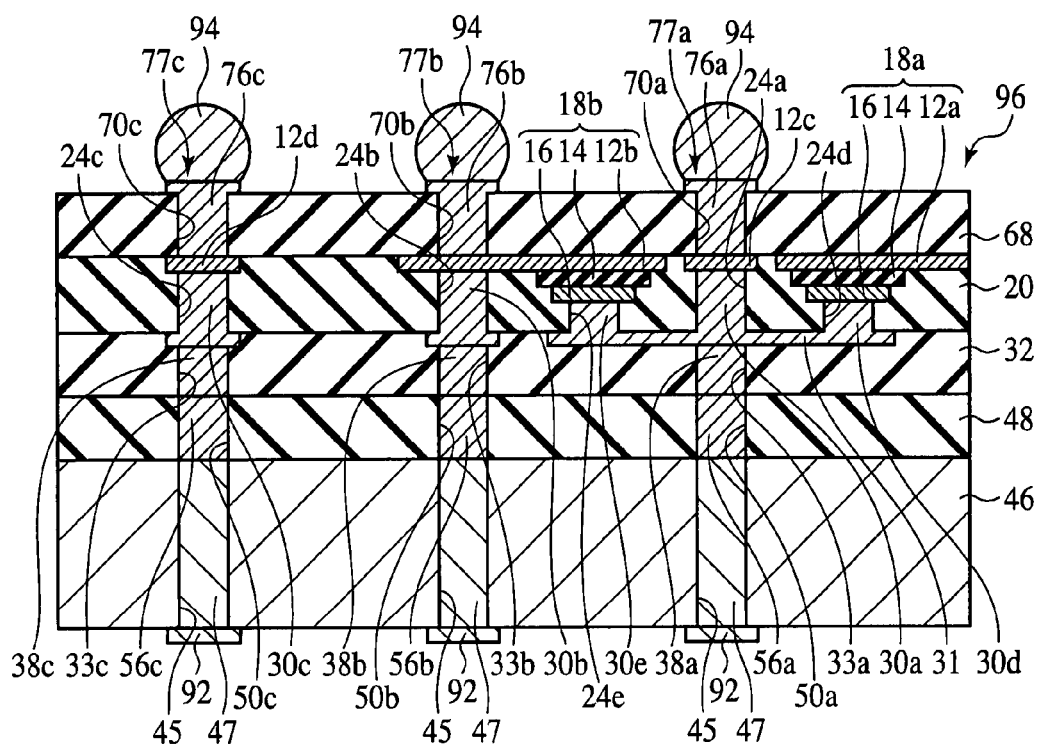

Next, the solder bumps 94 of, e.g., Sn-based solder are formed on one surfaces of the electrode pads 92 (opposite to the surfaces contacting the partial electrodes 56a-56c) by electroplating (see FIG. 21B).

Thus, the interposer 96 according to the present embodiment is manufactured.

Figure 22:
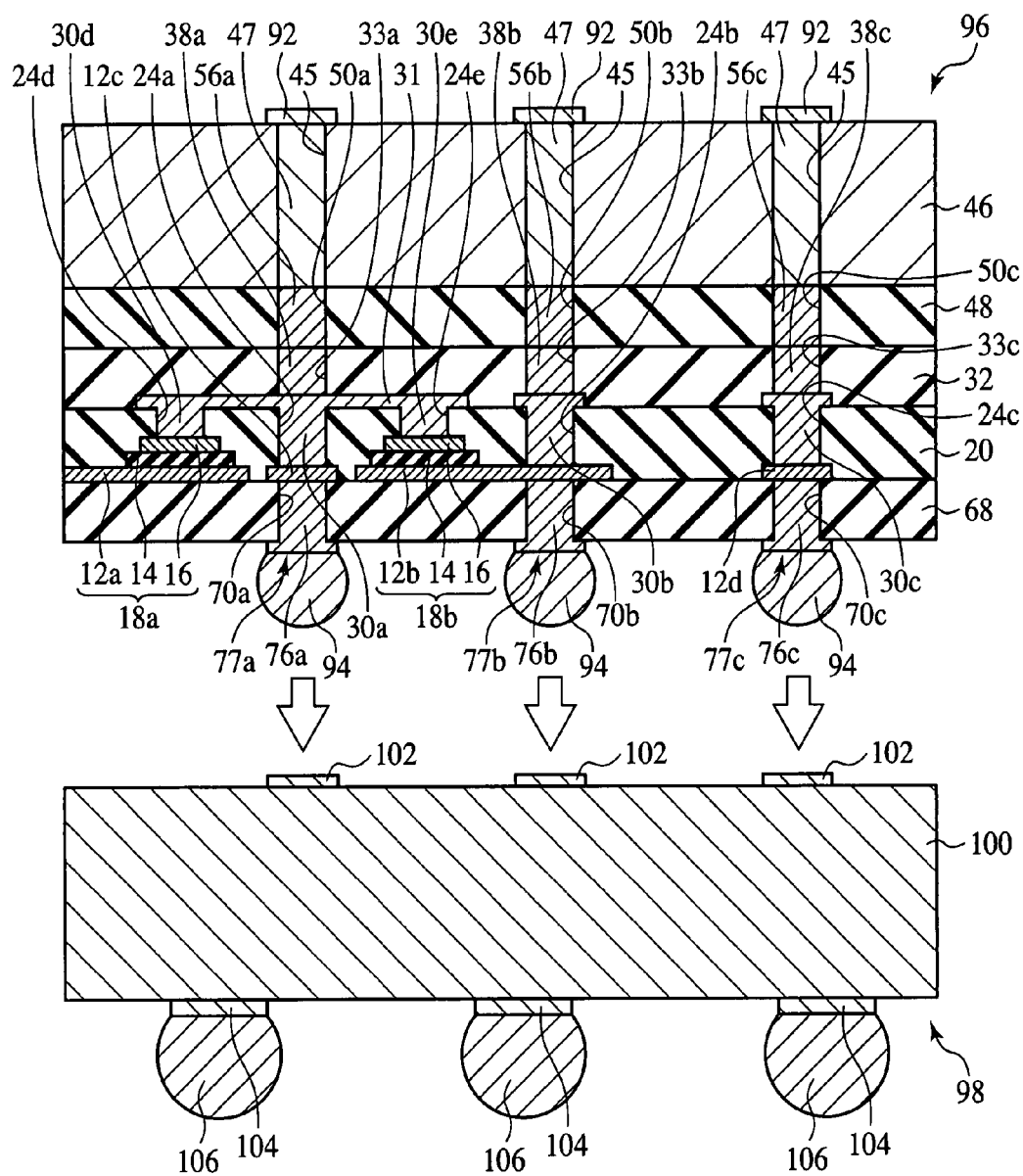
FIG. 22 is a view illustrating the steps of the method for manufacturing the interposer and the electronic device according to the embodiment of the present invention (Part 20).

Next, as illustrated in FIG. 22, the package substrate 98 is prepared. The package substrate 98 includes the substrate 100 with multilayer interconnections (not illustrated) buried in, the electrode pads 102 formed on one primary surface of the substrate 100 (opposed to the interposer 96), the electrode pads 104 formed on the other primary surface of the substrate 100 (opposite to the surface opposed to the interposer 96), and the solder bumps 106 formed on one surfaces of the electrode pads 104 (opposite to the surfaces contacting the substrate 100). The electrodes pads 102 are electrically connected to one of the multilayer interconnections buried in the substrate 100. The electrode pads 104 are electrically connected to one of the multilayer interconnections (not illustrated) buried in the substrate 100.

Next, the interposer 96 and the package substrate 98 are opposed to each other. At this time, with the solder bumps 94 of the interposers 96 and the electrode pads 102 of the package substrate 98 brought near each other, the interposer 96 and the package substrate 98 are opposed to each other.

Figure 23:
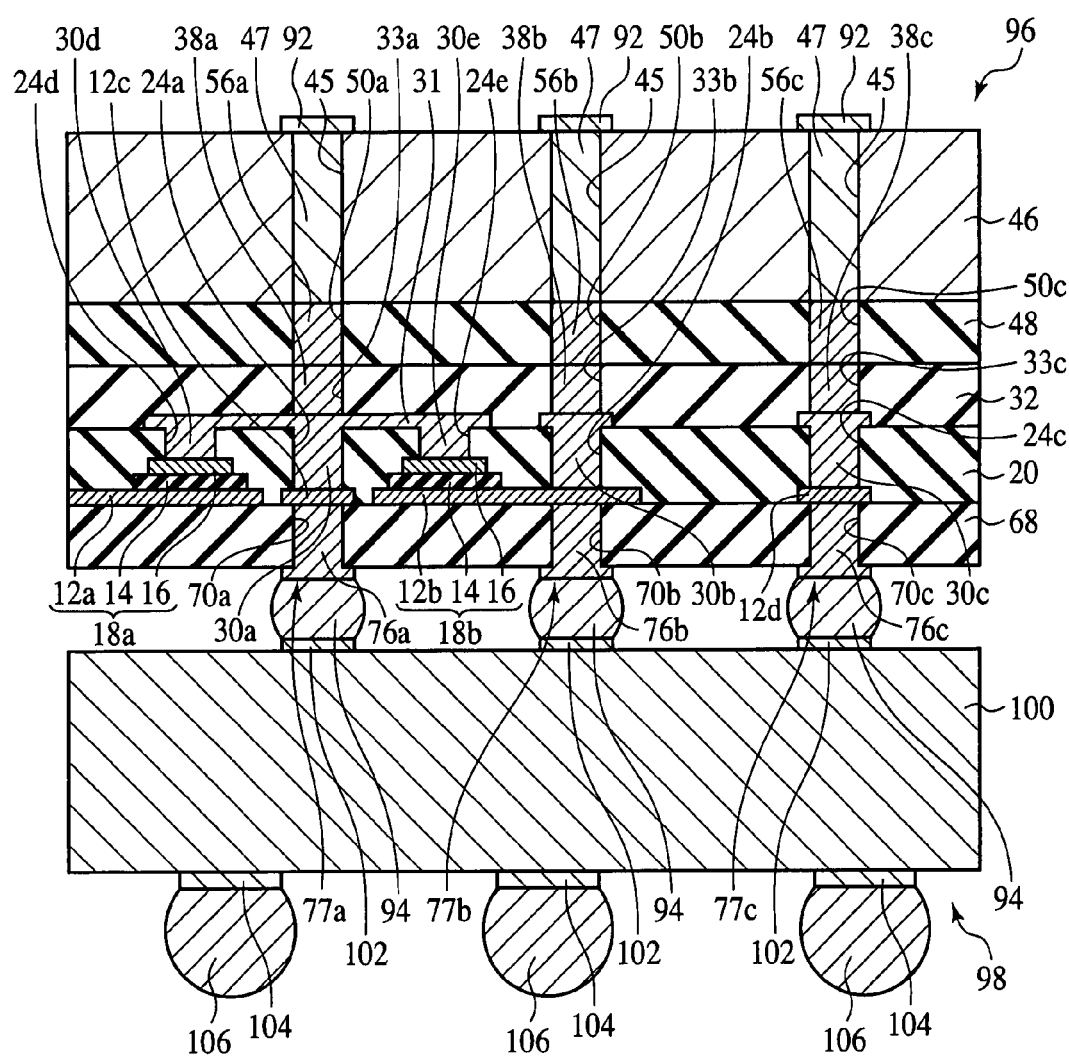
FIG. 23 is a view illustrating the steps of the method for manufacturing the interposer and the electronic device according to the embodiment of the present invention (Part 21).

Next, the solder bumps 94 of the interposer 96 and the electrode pads 102 of the package substrate 98 connected to each other by flip-chip bonding (see FIG. 23). Thus, the interposer 96 is mounted on the package substrate 98. To connect the solder bumps 94 and the electrode pads 102 to each other, thermal processing necessary to melt the solder bumps 94 is made.

Figure 24:
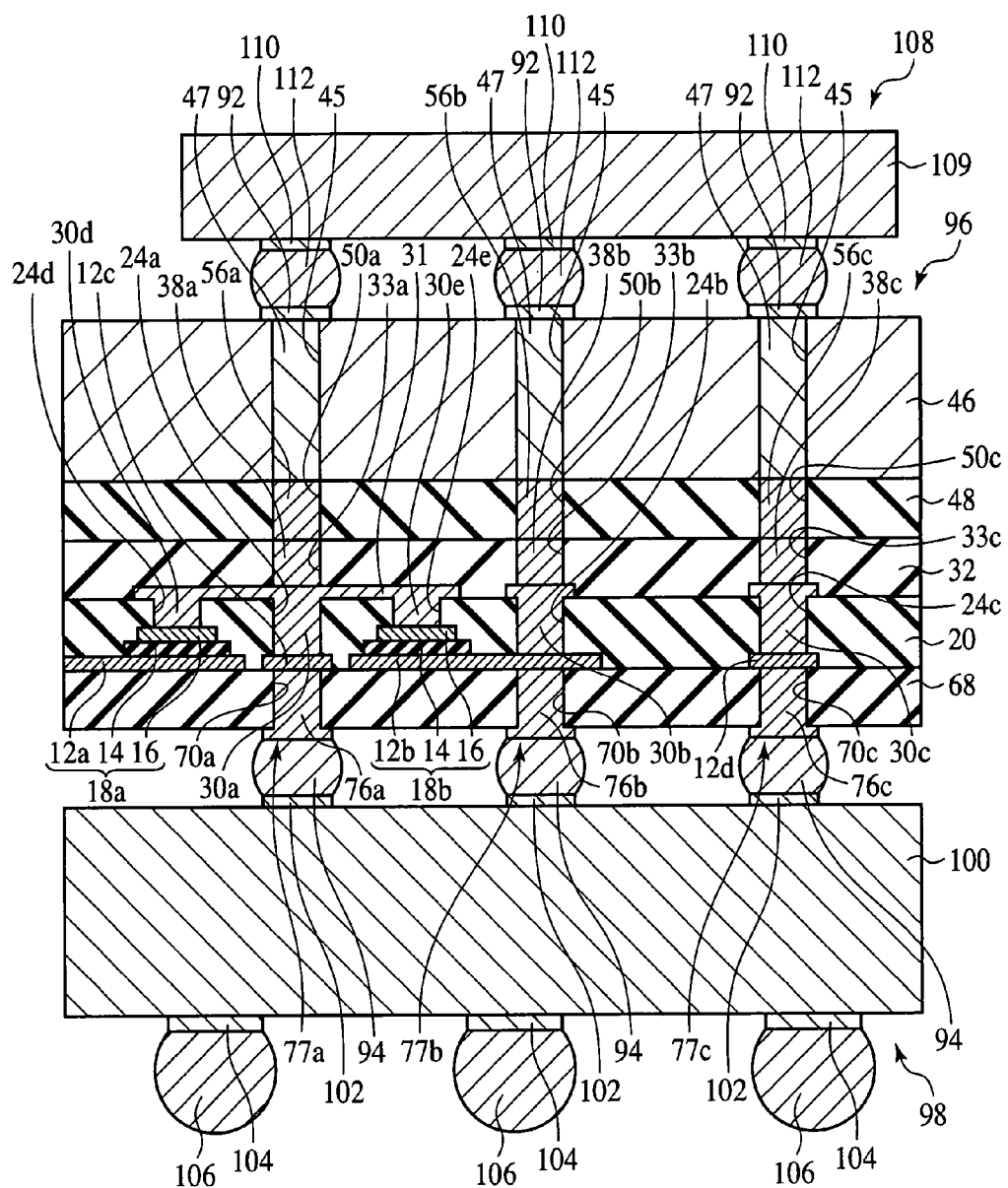
FIG. 24 is a view illustrating the steps of the method for manufacturing the interposer and the electronic device according to the embodiment of the present invention (Part 22).

Next, the semiconductor integrated circuit element 108 is prepared (see FIG. 24). The semiconductor integrated circuit element 108 includes the semiconductor substrate 109, and the electrode pads 110 formed on one primary surface of the semiconductor substrate 109 (opposed to the interposer 96). The semiconductor substrate 109 is, e.g., a silicon substrate. On one primary surface of the semiconductor substrate 109 (opposed to the interposer 96), an integrated circuit (not illustrated) including electronic circuit elements (not illustrated) is formed. That is, on one primary surface of the semiconductor substrate 109 (opposed to the interposer 96), active elements (not illustrated), such as transistors, etc. and/or passive elements (not illustrated), such as capacitors, etc. are disposed. On one primary surface of the semiconductor substrate 109 with such electronic circuit elements formed on (opposed to the interposer 96), a multilayer interconnection structure (not illustrated) including a plurality of inter-layer insulation films (not illustrated) and interconnection layers (not illustrated) is formed. Such multilayer interconnection structure electrically interconnects the electronic circuit elements (not illustrated). One of the interconnections formed in the plural layers is connected to the electrode pads 110.

Then, the solder bumps 112 of the semiconductor integrated circuit element 108 are connected to the partial electrodes 76a-76c by flip-chip bonding (see FIG. 24). Thus, the semiconductor integrated circuit element 108 is mounted on the interposer 96.

Thus, the electronic device including the interposer according to the present embodiment is manufactured.

The method for manufacturing the interposer according to the present embodiment is characterized mainly in that the thin film capacitors 18a, 18b including the crystalline dielectric thin film 14 are formed on the highly heat resistant semiconductor substrate 10, the resin layers 20, 32, 48 are supported by the glass substrate 46 with the through-electrodes 47 buried in, and then the semiconductor substrate 10 is removed.

According to the present embodiment, the thin film capacitors 18a, 18b are formed on the highly heat resistant semiconductor substrate 10, which makes it possible to form the very well crystallized dielectric thin film 14 of a relative dielectric constant of 200 or above. Thus, according to the present embodiment, the thin film capacitors 18a, 18b having very good electric characteristics can be formed. Furthermore, the semiconductor substrate 10 which is difficult to form the through-holes in is removed after the thin film capacitors 18a, 18b have been formed, which makes it unnecessary to form in the semiconductor substrate 10 the through-holes for burying the through-electrodes 70a-70c. The glass substrate 46 with the through-electrodes 47 buried in can be manufactured relatively easily, and costs much less in comparison with burying the through-electrodes in the semiconductor substrate 10. According to the present embodiment, the interposer 96 including the thin film capacitors 18a, 18b of very high capacitance can be provided at low costs.

(Modification 1)

Figure 25:
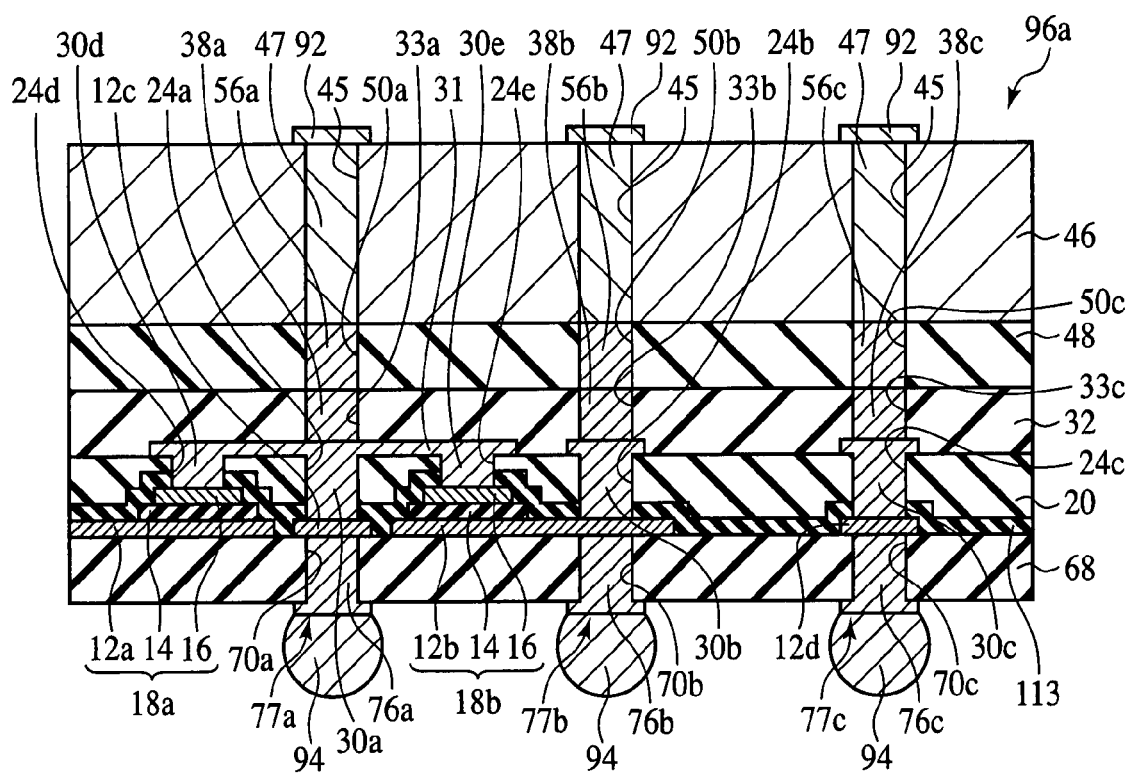
FIG. 25 is a sectional view of the interposer according to Modification 1 of the embodiment of the present embodiment.

Next, the interposer according to Modification 1 of the present embodiment and the method for manufacturing the interposer will be explained with reference to FIGS. 25 and 26. FIG. 25 is a sectional view of the interposer according to the present modification.

The interposer 96a according to the present modification is characterized mainly in that a protection film 113 is formed, covering thin film capacitors 18a, 18b.

When the resin layer 20 is formed of, e.g., polyimide resin, water and gas are often discharged from the resin layer 20 when the resin layer 20 is subjected to thermal processing or others. In such case, the dielectric thin film 14 is reduced with such water or gas to thereby cause oxygen defects in the crystals of the dielectric thin film 14, and the electric characteristics of the thin film capacitors 18a, 18b are deteriorated.

Then, in the present modification, to prevent the reduction, etc. of the dielectric thin film 14, a protection film (passivation layer) 113 of an inorganic material is formed, covering the thin film capacitors 18a, 18b (see FIG. 25). The protection film 113 is, e.g., aluminum oxide (alumina, $Al_2O_3$) film.

The passivation layer 113 is aluminum oxide film here but is not essentially aluminum oxide film. The passivation layer 113 can be formed suitably of an inorganic material which can protect water, gas or others. For example, the passivation layer 113 may be formed of silicon dioxide ($SiO_2$) or silicon nitride ($Si_3N_4$).

As described above, the passivation layer 113 is formed, covering the thin film capacitors 18a, 18b, and the resin layer 20 may be formed on the passivation layer 113. According to the present modification, in which the reduction, etc. of the dielectric thin film 14 can be prevented by the passivation layer 113, even when the resin layer 20 is formed of a material which is caused to discharge water, etc. by thermal processing, the interposer including the thin film capacitors 18a, 18b of good electric characteristics can be provided.

Next, the method for manufacturing the interposer according to the present modification will be explained with reference to FIGS. 26A to 26D. FIGS. 26A to 26D are sectional views of the interposer according to the present modification in the steps of the method for manufacturing the interposer, which illustrate the method.

Figure 26A:
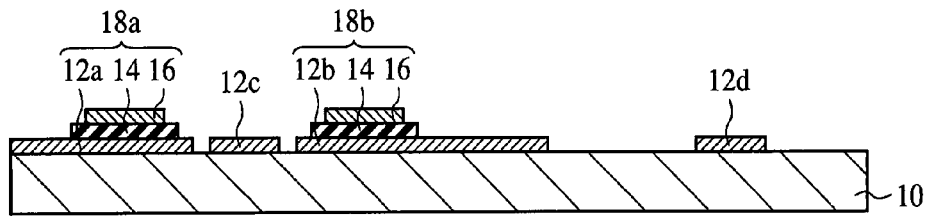
FIGS. 26A to 26D are sectional views of the interposer according to Modification 1 of the embodiment of the present invention in the steps of the method for manufacturing the interposer.

First, the semiconductor substrate 10 is prepared in the same way as in the method for manufacturing the interposer described above with reference to FIG. 3A (see FIG. 26A).

Next, in the same way as in the method or manufacturing the interposer described above with reference to FIG. 3B, silicon dioxide film (not illustrated) is formed on the surface of the semiconductor substrate 10 by thermal oxidation.

Then, in the same way as in the method for manufacturing the interposer described above with reference to FIG. 3B, a conduction film 12 of, e.g., titanium oxide ($TiO_2$) film and platinum (Pt) film sequentially laid is formed on the semiconductor substrate 10 by, e.g., sputtering.

Next, in the same way as in the method for manufacturing the interposer described above with reference to FIG. 3B, the crystalline dielectric thin film 14 is formed on the conduction film 12 by, e.g., sputtering. Specifically, crystalline $Ba_xSr_{1-x}TiO_3$ (BST) thin film 14, for example, is formed.

Next, a conduction film 16 of, e.g., gold (Au) film is formed on the dielectric thin film 14 by, e.g. sputtering. The conduction film 16 is to be the upper electrodes (capacitor electrodes) of the capacitors 18a, 18b. The film thickness of the Au film is, e.g., 100 nm.

Next, in the same way as in the method for manufacturing the interposer described above with reference to FIGS. 3C to 3E, the conduction film 16, the dielectric thin film 14 and the conduction film 12 are sequentially patterned into prescribed configurations by photolithography.

Thus, the thin film capacitor 18a including the capacitor electrode 12a, the dielectric thin film 14 and the capacitor electrode 16 is formed. The thin film capacitor 18b including the capacitor electrode 12b, the dielectric thin film 14 and the capacitor electrode 16 is formed.

Figure 26B:
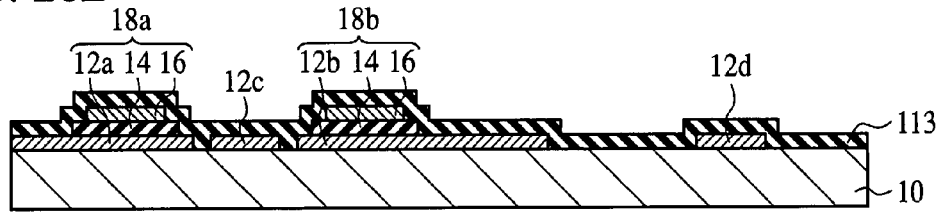

Then, the passivation layer 113 is formed by, e.g., sputtering, covering the capacitor 18a, 18b (see FIG. 26B). The protection film 113 is, e.g., aluminum oxide film. The density of the protection film 113 of aluminum oxide is preferably 2.6 g/cm$^3$ or above. The protection film 113 of such high density is formed, so that the water, gas, etc. discharged from the resin film 20 is barriered by the passivation layer 113. The film thickness of the passivation layer 113 is, e.g., about 100 nm.

The film forming conditions for forming the passivation layer 113 of aluminum oxide are as exemplified below. The substrate temperature is, e.g., 80° C. The RF power is, e.g., 500 W. The gas pressure inside the film forming chamber is, e.g., 0.1 Pa. The flow rate ratio of argon gas vs. oxygen gas is, e.g., 5:1.

Thus, the passivation layer 113 is formed, covering the thin film capacitors 18a, 18b.

Figure 26C:
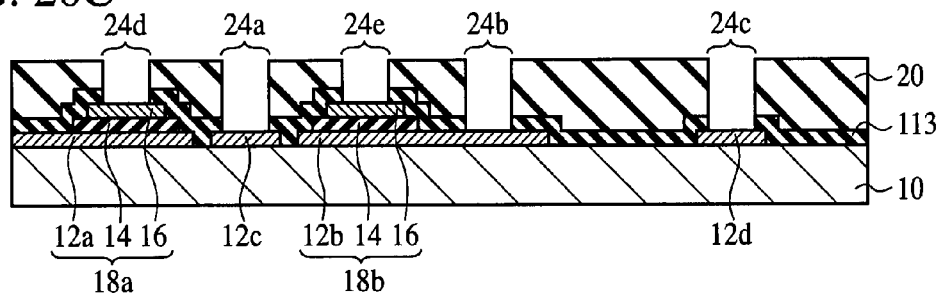
Figure 26D:
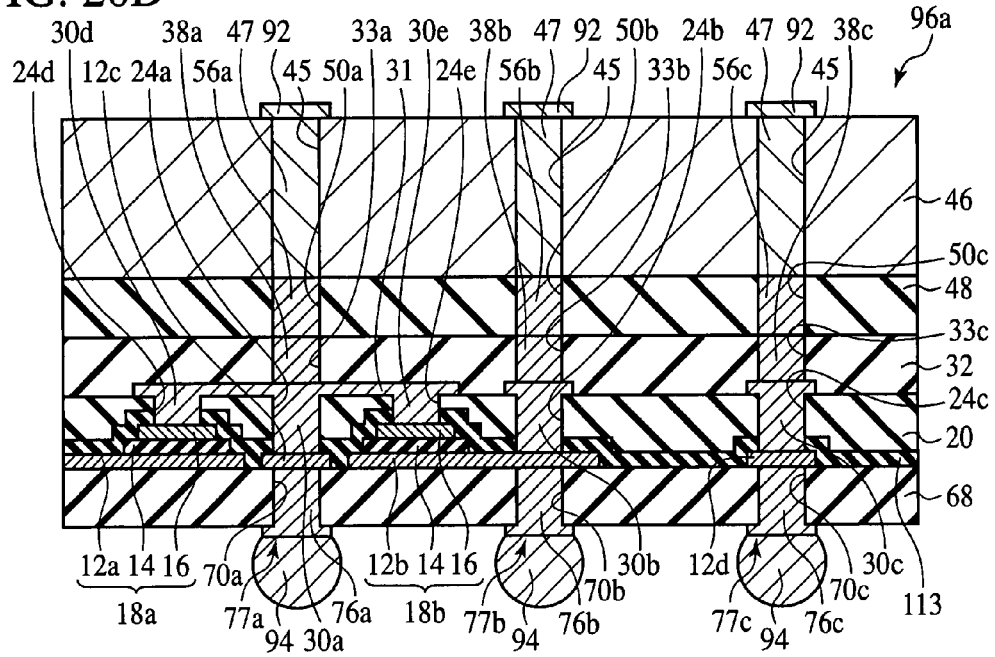

Next, the resin layer 20 is formed on the semiconductor substrate 10 with the capacitors 18a, 18b and the conduction films 12a, 12b formed on (see FIG. 26C). The resin layer 20 is formed of, e.g., photosensitive polyimide resin.

Such resin layer 20 can be formed as exemplified below. First, a photosensitive polyimide resin solution is applied to the semiconductor substrate 10 by spin coating. The conditions for applying the polyimide resin solution are, e.g., 2000 rpm and 30 seconds. Thus, the resin layer 20 of, e.g., a 8 μm-thickness is formed. Then, thermal processing (pre-baking) is made on the resin layer 20. The thermal processing temperature is, e.g., 200° C.

Next, openings 24a-24e are formed in the resin layer 20 down to the passivation layer 113 by photolithography.

Next, thermal processing (main baking) is made on the resin layer 20. The thermal processing temperature is, e.g., 400° C. The film thickness of the resin layer 20 after subjected to the thermal processing is, e.g., about 3 μm.

Next, the passivation layer 113 exposed in the openings 24a-24e is etched off. Thus, the opening 24a, the opening 24b, the opening 24c, the opening 24d, the opening 24e are formed in the resin layer 20 respectively down to the conduction film 12c, the capacitor electrode 12b, the conduction film 12d, the capacitor electrode 16 of the capacitor 18a and the capacitor electrode 16 of the capacitor 18b.

Then, the following process of the method for manufacturing the interposer is the same as that of the method for manufacturing the interposer according to the first embodiment illustrated in FIGS. 4C to 21B, and the explanation will not be repeated. Thus, the interposer 96a according to the present modification is manufactured (see FIG. 26D).

As described above, it is possible to form the passivation layer 113, covering the thin film capacitors 18a, 18b, and the resin layer 20 is formed on the protection film 113. According to the present modification, the reduction, etc. of the dielectric thin film 14 can be prevented by the passivation layer 113, whereby even when the resin layer 20 is formed of a material which is caused to discharge water, etc. by thermal processing, the interposer including the thin film capacitors 18a, 18b of good electric characteristics can be provided.

(Modification 2)

Figure 27:
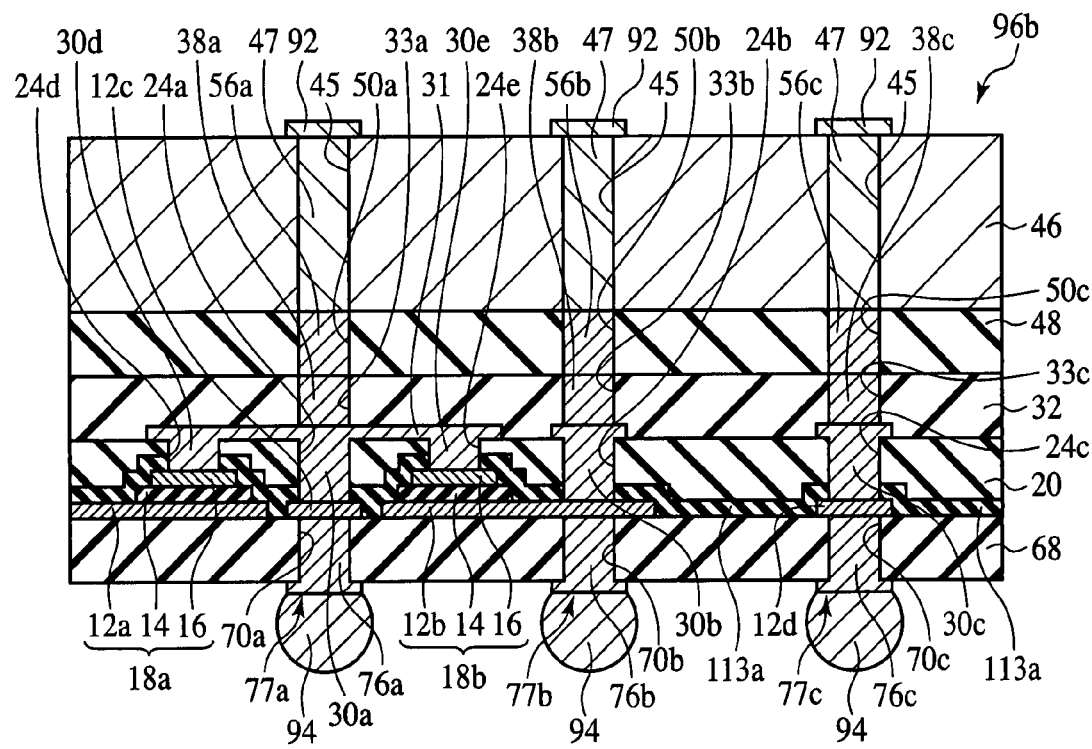
FIG. 27 is a sectional view of the interposer according to Modification 2 of the embodiment of the present embodiment.

Next the interposer according to a second modification and the method for manufacturing the interposer will be explained with reference to FIGS. 27 and 28. FIG. 27 is a sectional view of the interposer according to the present modification.

The interposer according to the present modification is characterized mainly in that a passivation layer 113a covering thin film capacitors 18a, 18b is formed of amorphous film of the same material as the dielectric thin film 14.

As illustrated in FIG. 27, in the present modification, the passivation layer 113a is formed, covering the thin film capacitors 18a, 18b, and a resin layer 20 is formed on the passivation layer 113a. The passivation layer 113a is an amorphous film of the same material as the dielectric thin film 14. The passivation layer 113a is the amorphous film, so that when the passivation layer 113a is polycrystal film, water, gas, etc. pass through the grain boundaries, and cannot sufficiently barrier the water, gas, etc.

As in the present modification, the passivation layer 113a covering the thin film capacitors 18a, 18b is amorphous film of the same material as the dielectric thin film 14, whereby because the thermal expansion coefficient of the dielectric thin film 14 is equal to the thermal expansion coefficient of the passivation layer 113a, no unnecessary mechanical stress is exerted to the thin film capacitors 18a, 18b. A BST film used as the dielectric thin film 14 has good adhesion. According to the present embodiment, the interposer can have higher reliability.

Next, the method for manufacturing the interposer according to the present modification will be explained with reference to FIGS. 28A to 28D. FIGS. 28A to 28D are sectional views of the interposer according to the present modification in the steps of the method for manufacturing the interposer, which illustrate the method.

Figure 28A:
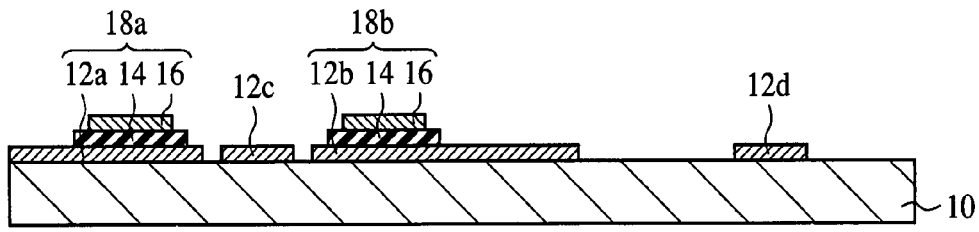
FIGS. 28A to 28D are sectional views of the interposer according to Modification 2 of the embodiment of the present invention in the steps of the method for manufacturing the interposer.

First, in the same way as in the method for manufacturing the interposer described above with reference to FIG. 3A, the semiconductor substrate 10 is prepared (see FIG. 28A).

Next, in the same way as in the method for manufacturing the interposer described above with reference to FIG. 3B, silicon oxide film (not illustrated) is formed on the surface of the semiconductor substrate 10 by thermal oxidation.

Next, in the same way as in the method for manufacturing the interposer described with reference to FIG. 3B, the conduction film 12 of, titanium oxide ($TiO_2$) film and platinum (Pt) film sequentially laid is formed on the semiconductor substrate 10 by, e.g., sputtering.

Next, in the same way as in the method for manufacturing the interposer described above with reference to FIG. 3B, the crystalline dielectric thin film 14 is formed on the conduction film 12 by, e.g., sputtering. Specifically, crystalline $Ba_X Sr_{1-X}TiO_3$ (BST) film 14, for example, is formed.

Next, the conduction film 16 of, e.g., gold (Au) film is formed on the dielectric thin film 14 by, e.g., sputtering. The conduction film 16 is to be the upper electrodes (capacitor electrodes) of the capacitors 18a, 18b. The film thickness of the Au film is, e.g., 100 nm.

Next, in the same way as in the method for manufacturing the interposer described above with reference to FIGS. 3C to 3E, the conduction film 16, the dielectric thin film 14 and the conduction film 12 are patterned into prescribed configurations by photolithography.

Thus, the thin film capacitor 18a including the capacitor electrode 12a, the dielectric thin film 14 and the capacitor electrode 16 is formed. The thin film capacitor 18b including the capacitor electrode 12b, the dielectric thin film 14 and the capacitor electrode 16 is formed.

Figure 28B:
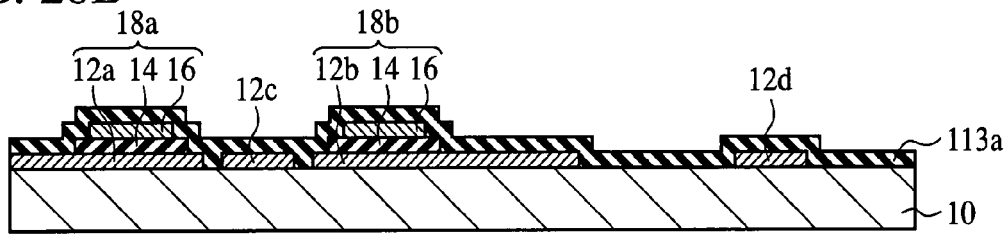

Then, the passivation layer 113a is formed by, e.g., sputtering, covering the capacitors 18a, 18b (see FIG. 28B). As the passivation layer 113a, amorphous BST film, for example, is formed. The film thickness of the passivation layer 113a is, e.g., about 100 nm.

The film forming conditions for forming the passivation layer 113a of amorphous BST are as exemplified below. The substrate temperature is, e.g., 50° C. The applied electric power is, e.g., 600 W. The gas pressure inside the film forming chamber is, e.g., 0.2 Pa. The flow rate ratio of argon gas vs. oxygen gas is, e.g., 8:1.

Thus, the passivation layer 113a is formed, covering the thin film capacitors 18a, 18b.

Figure 28C:
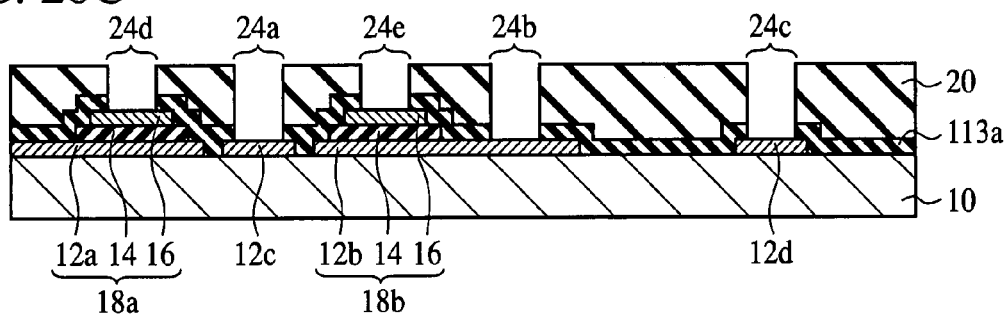
Figure 28D:
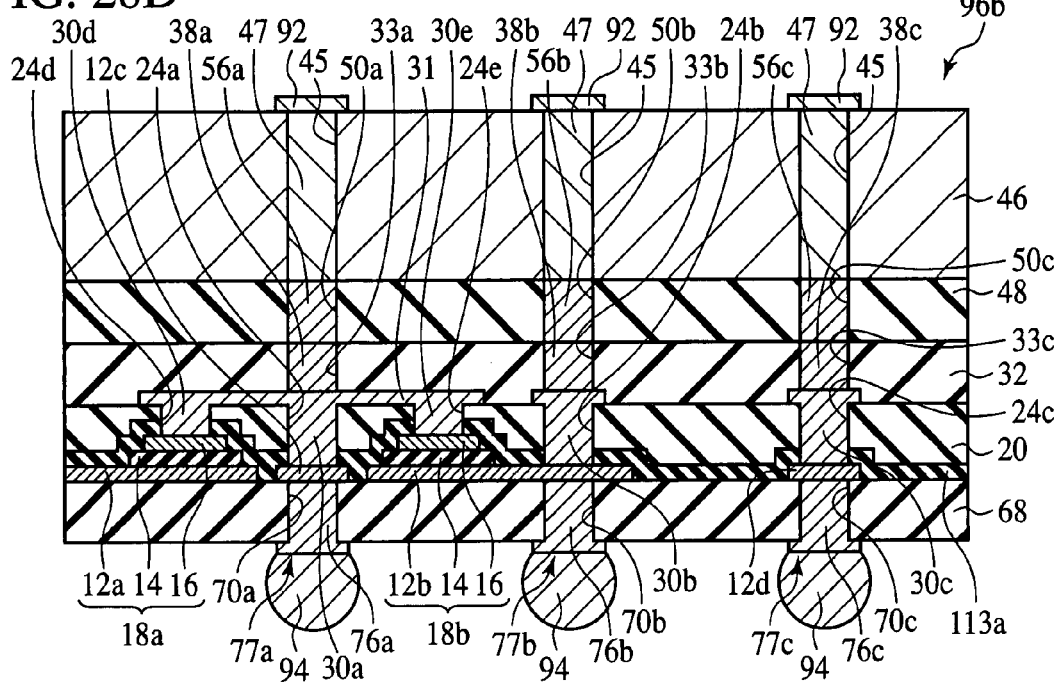

Next, the resin layer 20 is formed on the semiconductor substrate 10 with the capacitors 18a, 18b and the conduction films 12a, 12b formed on (see FIG. 28C). The resin layer 20 is, e.g., photosensitive polyimide resin.

Such resin layer 20 can be formed as exemplified below. That is, first, a photosensitive polyimide resin solution is applied to the semiconductor substrate 10. The conditions for applying the polyimide resin solution are, e.g., 2000 rpm and 30 seconds. Thus, the resin layer 20 of, e.g., a 8 μm-thickness is formed. Then, thermal processing (pre-bake) is made on the resin layer 20. The thermal processing temperature is, e.g., 200° C.

Then, the openings 24a-24e are formed in the resin layer 20 down to the passivation layer 113a by photolithography.

Next, thermal processing (main bake) is made on the resin layer 20. The thermal processing temperature is, e.g., 400° C. The film thickness of the resin layer 20 after subjected to the thermal processing is, e.g., about 4 μm.

Then, the passivation layer 113a exposed in the openings 24a-24e is etched off. Thus, the opening 24a, the opening 24b, the opening 24c, the opening 24d and the opening 24e are formed in the resin layer 20 respectively down to the conduction film 12c, the capacitor electrode 12b, the conduction film 12d, the capacitor electrode 16 of the capacitor 18a and the capacitor electrode 16 of the capacitor 18b.

The following process of the method for manufacturing the interposer is the same as that of the method for manufacturing the interposer according to the first embodiment illustrated in FIGS. 4C to 21B, and the explanation will not be repeated. Thus, the interposer according to the present modification is manufactured (see FIG. 28D).

As in the present modification, it is possible that the passivation layer 113a covering the thin film capacitors 18a, 18b is amorphous film of the same material as the dielectric thin film 14, and the resin layer 20 is formed on such passivation layer 113a. According to the present modification, the thermal expansion coefficient of the dielectric thin film 14 and the thermal expansion coefficient of the passivation layer 113a are equal to each other, whereby no unnecessary mechanical stress is exerted to the thin film capacitors 18a, 18b. Thus, according to the present modification, the interposer of higher reliability can be provided.

Modified Embodiments

The present invention is not limited to the above-described embodiment and can cover other various modifications.

For example, in the above-described embodiment, the dielectric thin film 14 is BST film but is not essentially BST film. For example, the dielectric thin film 14 may be PbZr$_x$Ti$_{1-x}$O$_3$ (PZT) film. The conditions for forming the dielectric thin film 14 of PZT are as exemplified below. The substrate temperature is, e.g., 200° C. The gas pressure inside the film forming chamber is, e.g., 0.5 Pa. The flow rate ratio of argon gas vs. oxygen gas is, e.g., 9:1. The applied electric power is, e.g., 120 W. The film forming period of time is, e.g., 60 minutes. When the dielectric thin film 14 of PZT is formed under these conditions, the dielectric thin film 14 of an about 100 nm-thickness having good electric characteristics of an about 200 relative dielectric constant can be formed.

The dielectric thin film 14 may not be limited to BST film and PZT film. For example, the dielectric thin film 14 may be formed of a composite oxide containing at least one of the elements of Sr, Ba, Pb, Zr, Bi, Ta, Ti, Mg and Nb.

In the above-described embodiment, the resin layers 20, 68 are formed of epoxy resin but are not formed essentially of epoxy resin. For example, the resin layers 20, 60 may be formed of benzocyclobutene (BCB) resin, polyimide resin, bismaleimide resin, maleimide resin, cyanate resin, polyphenylene ether resin, polyphenylene oxide resin, fluorine-containing resin, liquid crystal polymer, polyetherimide resin, polyether etherketone resin or others.

When the resin layers 20, 68 are formed of BCB resin, the resin layers 20, 68 of BCB resin are formed under the conditions as exemplified below. The conditions for applying a resin solution of BCB resin are, e.g., 2000 rpm and 30 seconds. The thickness of the resin layers 20, 68 as applied is, e.g., about 5 μm. The temperature of the pre-bake is, e.g., about 150° C. The temperature of the main bake is, e.g., about 260° C. The resin layers 20, 68 thus formed of BCB have, e.g., an about 3 μm-thickness after the main bake.

In the above-described embodiment, the resin layers 32, 48 are formed of BCB resin but may not be formed essentially BCB resin. For example, the resin layers 32, 48 may be formed of polyimide resin, epoxy resin, bismaleimide resin, maleimide resin, cyanate resin, polyphenylene ether resin, polyphenylene oxide resin, fluorine-containing resin, liquid crystal polymer, polyether imide resin, polyether etherketone resin or others.

In the above-described embodiment, the capacitor electrodes 12a, 12b, 16 are formed of Pt or others but may not be essentially formed of Pt or others. For example, the capacitor electrodes 12a, 12b, 16 may be formed suitably of Au, Cr, Cu, W, Pt, Pd, Ru, Ru oxide, Ir, Ir oxide, Pt oxide or others.

In the above-described embodiment, the through-electrodes 47 buried in the glass substrate 46 are formed of FeNiCo (iron-nickel-cobalt) alloy. However, the through-electrodes 47 buried in the glass substrate 46 may not be formed essentially of FeNiCo alloy. For example, the through-electrodes 47 buried in the glass substrate 46 may be formed of Au. The through-electrodes 47 are formed of Au, whereby the through-electrodes 47 can be less resistant.

In the above-described embodiment, the partial electrodes 76a-76c, 30a-30c, 38a-38c buried in the resin layers 68, 20, 32 are formed of Cu to form the through-electrodes 77a-77c of Cu. However, the through-electrodes 77a-77c may not be formed essentially of Cu. For example, the partial electrodes 76a-76c, 30a-30c, 38a-38c are formed of Au to form the through-electrodes 77a-77c of Au. The through-electrodes 77a-77c are formed of Au, whereby the through-electrodes 77a-77c can be less resistant. The through-electrodes 77a-77c may not be formed essentially of these materials and may be formed suitably of material containing at least one of Cu, Ni, Au and Sn.

In the above-described embodiment, the partial electrodes 56a-56c buried in the resin layer 48 are formed of Cu but may not be formed essentially of Cu. For example, the partial electrodes 56a-56c may be formed of Au. The partial electrodes 56a-56c are formed of Au, whereby the partial electrodes 56a-56c can be less resistant. The partial electrodes 56a-56c may not be formed essentially of these materials.

The partial electrodes 56a-56c may be formed suitably of a material containing one of Cu, Ni, Au and Sn.

What is claimed is:

1. An interposer comprising:
   a glass substrate with a first through-electrode buried in;
   a plurality of resin layers supported by the glass substrate;
   a thin film capacitor buried between a first resin layer of said plurality of resin layers and a second resin layer of said plurality of resin layers, the thin film capacitor including a first capacitor electrode, a second capacitor electrode opposed to the first capacitor electrode and formed only directly over the first capacitor electrode, and a dielectric thin film of a relative dielectric constant of 200 or above formed only directly over the first capacitor electrode and between the first capacitor electrode and the second capacitor electrode;
   a second through-electrode penetrating said plurality of resin layers, electrically connected to the first through-electrode, and electrically connected to the first capacitor electrode or the second capacitor electrode;
   an opening formed in the second resin layer, the opening exposing the second capacitor electrode; and
   a conductor plug buried in the opening,
   wherein the second through-electrode is electrically connected to the second capacitor electrode via the conductor plug and an interconnection formed on the second resin layer.

2. The interposer according to claim 1, further comprising:
   a third resin layer of the plurality of resin layers;
   a fourth resin layer formed over one primary surface of the glass substrate and adhered to the third resin layer; and
   a partial electrode buried in the fourth resin layer and connected to the first through-electrode and the second through-electrode.

3. The interposer according to claim 1, wherein the glass substrate is formed of borosilicate glass.

4. The interposer according to claim 1, wherein the fourth resin layer and the third resin layer are formed of a thermosetting resin which is cured without producing a by-product.

5. The interposer according to claim 1, wherein the fourth resin layer and the third resin layer are formed of benzocyclobutene resin, polyimide resin, epoxy resin, bismaleimide resin, maleimide resin, cyanate resin, polyphenylene ether resin, polyphenylene oxide resin, fluorine-containing resin, liquid crystal polymer, polyether imide resin or polyether etherketone resin.

6. The interposer according to claim 1, wherein the first through-electrode is formed of FeNiCo alloy or Au.

7. The interposer according to claim 1, wherein the second through-electrode contains at least one of Cu, Ni, Au and Sn.

8. The interposer according to claim 1, wherein the dielectric thin film is formed of a composite oxide containing at least one element of Sr, Ba, Pb, Zr, Bi, Ta, Ti, Mg and Nb.

9. The interposer according to claim 1, further comprising a passivation layer of an inorganic material formed, covering the thin film capacitor.

10. The interposer according to claim 9, wherein the passivation layer is formed of aluminum oxide, silicon dioxide or silicon nitride.

11. The interposer according to claim 9, wherein the passivation layer is an amorphous film formed of the same material as the dielectric thin film.

12. The interposer according to claim 1, wherein the capacitor electrode is formed of Au, Cr, Cu, W, Pt, Pd, Ru, Ru oxide, Ir, Ir oxide or Pt oxide.

* * * * *